United States Patent
Ponnuvel et al.

(10) Patent No.: US 11,693,753 B2
(45) Date of Patent: Jul. 4, 2023

(54) ENHANCED IN-SYSTEM TEST COVERAGE BASED ON DETECTING COMPONENT DEGRADATION

(71) Applicant: NVIDIA Corporation, San Jose, CA (US)

(72) Inventors: Gunaseelan Ponnuvel, San Jose, CA (US); Ashish Karandikar, Cupertino, CA (US)

(73) Assignee: NVIDIA Corporation, Santa Clara, CA (US)

(*) Notice: Subject to any disclaimer, the term of this patent is extended or adjusted under 35 U.S.C. 154(b) by 242 days.

(21) Appl. No.: 16/601,900

(22) Filed: Oct. 15, 2019

(65) Prior Publication Data
US 2020/0117565 A1    Apr. 16, 2020

Related U.S. Application Data

(60) Provisional application No. 62/745,904, filed on Oct. 15, 2018.

(51) Int. Cl.
*G06F 11/27* (2006.01)
*G06F 11/07* (2006.01)
(Continued)

(52) U.S. Cl.
CPC .......... *G06F 11/27* (2013.01); *G05D 1/0055* (2013.01); *G05D 1/0088* (2013.01);
(Continued)

(58) Field of Classification Search
CPC .... G06F 11/24; G06F 11/3062; G06F 1/3225; G06F 11/27; G06F 11/1048; G06F 11/076; G06F 11/0793; G06F 11/2236; G06F 11/263; G06F 11/3024; G06F 11/328; G06F 11/0739; G06F 11/079; G06F 11/22; G06F 1/3296; G01R 31/3004; G01R 31/52;
(Continued)

(56) References Cited

U.S. PATENT DOCUMENTS 9,580,080 B1 *  2/2017 Letwin ................. B60W 50/08
10,885,698 B2   1/2021 Muthler et al.
(Continued)

OTHER PUBLICATIONS

International Search Report and Written Opinion received for PCT Patent Application No. PCT/US2019/056263, dated Jan. 27, 2020, 13 pages.
(Continued)

*Primary Examiner* — April Y Blair
*Assistant Examiner* — Sazzad Hossain
(74) *Attorney, Agent, or Firm* — Taylor English Duma L.L.P.

(57) ABSTRACT

In various examples, permanent faults in hardware component(s) and/or connections to the hardware component(s) of a computing platform may be predicted before they occur using in-system testing. As a result of this prediction, one or more remedial actions may be determined to enhance the safety of the computing platform (e.g., an autonomous vehicle). A degradation rate of a performance characteristic associated with the hardware component may be determined, detected, and/or computed by monitoring values of performance characteristics over time using fault testing.

20 Claims, 13 Drawing Sheets

(51) Int. Cl.

| | |
|---|---|
| *G06F 1/3296* | (2019.01) |
| *G05D 1/00* | (2006.01) |
| *G06F 11/22* | (2006.01) |
| *G06F 1/3225* | (2019.01) |
| *G11C 29/50* | (2006.01) |
| *G01R 31/30* | (2006.01) |
| *G06F 11/263* | (2006.01) |
| *G01R 31/52* | (2020.01) |
| *G06F 11/30* | (2006.01) |
| *G06F 11/10* | (2006.01) |
| *G01R 31/3187* | (2006.01) |
| *G06F 11/24* | (2006.01) |

(52) U.S. Cl.
CPC .......... *G06F 1/3296* (2013.01); *G06F 11/076* (2013.01); *G06F 11/0793* (2013.01); *G01R 31/3004* (2013.01); *G01R 31/3187* (2013.01); *G01R 31/52* (2020.01); *G06F 1/3225* (2013.01); *G06F 11/1048* (2013.01); *G06F 11/22* (2013.01); *G06F 11/2236* (2013.01); *G06F 11/24* (2013.01); *G06F 11/263* (2013.01); *G06F 11/3024* (2013.01); *G06F 11/3062* (2013.01); *G11C 29/50* (2013.01)

(58) Field of Classification Search
CPC .. G01R 31/3187; G11C 29/50; G05D 1/0055; G05D 1/0088
See application file for complete search history.

(56) References Cited

U.S. PATENT DOCUMENTS

| | | | | |
|---|---|---|---|---|
| 2006/0188045 | A1* | 8/2006 | Nygaard | ............... H04L 1/205 375/348 |
| 2008/0033684 | A1 | 2/2008 | Vian et al. | |
| 2009/0083598 | A1 | 3/2009 | Dixit et al. | |
| 2010/0188115 | A1* | 7/2010 | von Kaenel | .......... G06F 1/3296 326/16 |
| 2015/0061707 | A1 | 3/2015 | Balasubramanian et al. | |
| 2016/0225436 | A1* | 8/2016 | Wang | ................... G06F 11/076 |
| 2017/0186497 | A1 | 6/2017 | Rajwade et al. | |
| 2017/0357311 | A1 | 12/2017 | Hovis et al. | |

OTHER PUBLICATIONS

International Preliminary Report on Patentability received for PCT Application No. PCT/US2019/056263, dated Apr. 29, 2021, 11 pages.

"Taxonomy and Definitions for Terms Related to Driving Automation Systems for On-Road Motor Vehicles", National Highway Traffic Safety Administration (NHTSA), A Division of the US Department of Transportation, and the Society of Automotive Engineers (SAE), Standard No. J3016-201609, pp. 1-30 (Sep. 30, 2016).

"Taxonomy and Definitions for Terms Related to Driving Automation Systems for On-Road Motor Vehicles", National Highway Traffic Safety Administration (NHTSA), A Division of the US Department of Transportation, and the Society of Automotive Engineers (SAE), Standard No. J3016-201806, pp. 1-35 (Jun. 15, 2018).

ISO 26262, "Road vehicle—Functional safety," International standard for functional safety of electronic system, Retrieved from Internet URL: https://en.wikipedia.org/wiki/ISO_26262, accessed on Sep. 13, 2021, 8 pages.

IEC 61508, "Functional Safety of Electrical/Electronic/Programmable Electronic Safety-related Systems," Retrieved from Internet URL: https://en.wikipedia.org/wiki/IEC_61508, accessed on Apr. 1, 2022, 7 pages.

* cited by examiner

| | | V1 | V2 | V3 | V4 | Vsafe |
|---|---|---|---|---|---|---|
| 0km | Operational Speed 1622 | 460 | 490 | 520 | 550 | 650 |
| | Temperature 45 | F F F F F | P P P P P | P P P P P | P P P P P | P P P P P |
| 100km | Operational Speed 1622 | 440 | 470  330A | 500 | 530 | 650 |
| | Temperature 75 | F F F F F | F F P P P  330B | P P P P P | P P P P P | P P P P P |
| 1000km | Operational Speed 1622 | 480 | 510 | 540 | 580 | 650 |
| | Temperature 20 | F F F F F | F F F F F | F F F F F | P P P P P | P P P P P |
| 10000km | Operational Speed 1622 | 460 | 490 | 520 | 550 | 650 |
| | Temperature 45 | F F F F F | F F F F F | F F F F F | P P P P P | P P P P P |

FIG. 3

ENHANCED IN-SYSTEM TEST COVERAGE BASED ON DETECTING COMPONENT DEGRADATION

CROSS-REFERENCE TO RELATED APPLICATIONS

This application claims the benefit of U.S. Provisional Application No. 62/745,904, filed on Oct. 15, 2018, titled "Enhanced In-System Test Coverage in Autonomous Vehicle Components" which is hereby incorporated by reference in its entirety.

BACKGROUND

Computing chips and other circuitry are typically tested by manufacturers prior to deployment and/or distribution to verify whether they are functioning properly and to detect manufacturing defects. For example, computing chips may be tested prior to deployment using Automated Test Equipment (ATE). However, some chips develop defects after being deployed due to various factors (e.g., environmental hazards, aging, etc.), and in many applications it is important to have in-field fault detection capabilities. For example, autonomous functional safety requirements specify that components are to adhere to a Fault Tolerant Time Interval (FTTI) of 100 milliseconds, which represents a permitted time between an occurrence of a permanent fault and the execution of a remedial action.

Conventionally, an In-System Test (IST) may be used to detect the occurrence of a permanent fault when it occurs in order to adhere to an FTTI. However, while a hardware component—such as an Integrated Circuit (IC)—may pass an IST, there may be latent defects in the component or connections to the component that develop over time. As the latent defects develop, the component may typically provide proper outputs—but occasionally provide improper outputs—such that fault testing does not result in the detection of permanent faults. Thus, up to the point where the latent defects develop into a permanent fault that is detectable by an IST system, the autonomous vehicle may be operating with some faulty outputs that could compromise the safety of the vehicle.

SUMMARY

Embodiments of the present disclosure relate to enhanced in-system test coverage based on detecting component degradation. In some respects, systems and methods are disclosed that provide for determining a degradation rate of a performance characteristic associated with a hardware component from results of multiple instances of a fault test on the hardware component over time. The degradation rate may be used to predict permanent faults before they occur and/or perform one or more other remedial actions.

In some respects, a performance characteristic (e.g., Vmin, leakage current, etc.) of a hardware component may be monitored over time using fault tests and used to compute a degradation rate of the hardware component. Where a degradation rate is greater than a reference degradation rate, one or more remedial actions may be performed. The reference degradation rate may capture what is a typical degradation rate for an age and/or usage amount of the hardware component. An abnormally high degradation rate for the age and/or usage may indicate the hardware component is approaching a permanent fault.

In further respects, a performance characteristic may correspond to a cutoff value (e.g., a Vmin) of a physical operating parameter (e.g., a supply voltage, an operating clock speed) at which a hardware component is capable of passing a fault test. To detect (e.g., estimate) the cutoff value, multiple instances of the fault test may be run on the hardware component by applying different values of the physical operating parameter for each of the instances. From the fault tests, the system may determine a value of the physical operating parameter that corresponds to a transition between the hardware component passing the fault test and failing the fault test, and therefore corresponds to the cutoff value. For example, the cutoff value may be somewhere between a value of the physical operating parameter where the hardware component passed the fault test and a value of the physical operating parameter where the hardware component failed the fault test. In further respects, one or more machine learning models may be trained to predict permanent faults using system data, such as fault test results, degradation rates, environment data, etc.

BRIEF DESCRIPTION OF THE DRAWINGS

The present systems and methods for enhanced in-system test coverage based on detecting component degradation are described in detail below with reference to the attached drawing figures, wherein:

FIG. 3 presents an example table capturing aspects of performing multiple instances of a fault test on a hardware component, in accordance with some embodiments of the present disclosure;

DETAILED DESCRIPTION

Figure 1:
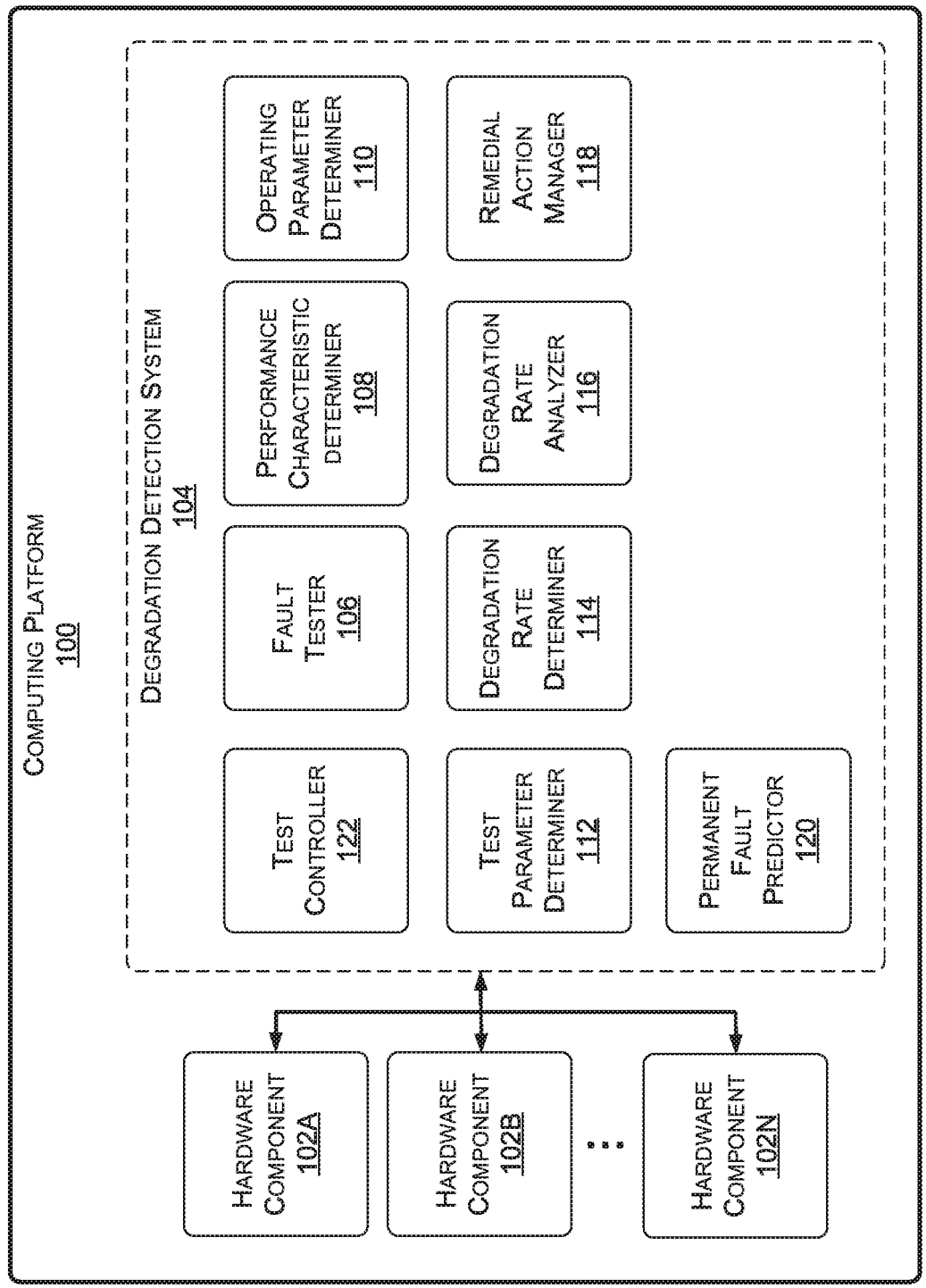
FIG. 1 is an example computing platform for predicting permanent faults in hardware components, in accordance with some embodiments of the present disclosure.

Embodiments of the present disclosure relate to enhanced in-system test coverage based on detecting component degradation. Systems and methods are disclosed that allow for determining, from results of multiple instances of a fault test on a hardware component over time, a degradation rate of a performance characteristic associated with the hardware component. The degradation rate may be used to predict permanent faults before they occur and/or determine one or more other remedial actions.

The disclosure provides approaches for predicting permanent faults in hardware component(s) and/or connections to the hardware component(s) of a computing platform (e.g., an autonomous vehicle) before they occur. Thus, one or more remedial actions may be taken to enhance the safety of the computing platform before a permanent fault occurs. In accordance to the disclosure, a degradation rate of a performance characteristic associated with the hardware component may be determined, detected, and/or computed to determine any remedial action that may be taken.

While a performance characteristic will often degrade over time (e.g., Vmin while still being in a safe range for operation), it has been found that a degradation rate that is abnormal can be an affective indicator of an impending permanent fault. Thus, disclosed approaches may determine and/or detect when the degradation rate is greater than a reference degradation rate and accordingly take some remedial action. For example, embodiments of the disclosure may leverage the observation that some types of latent defects degrade at an increasing rate as a permanent fault approaches, and therefore detecting that the performance characteristic (e.g., Vmin) is degrading too fast can be used to predict an impending permanent fault. Similarly, embodiments of the disclosure may leverage the observation that determining when the performance characteristic is degrading at a sufficiently faster rate than what is typical for the age of the component can be used to predict an impending permanent fault.

In some aspects of the present disclosure, the performance characteristic may be a cutoff value (also referred to as a physical operating parameter cutoff value) of a physical operating parameter at which a hardware component is capable of passing a fault test. For example, the performance characteristic may be a minimum supply voltage at which the hardware component is capable of passing the fault test. In some embodiments, the cutoff value may be detected (e.g., estimated) by performing multiple instances of the fault test on the hardware component by applying different values of the physical operating parameter for each of the instances (in other embodiments physical operating parameters may remain fixed). From the fault tests, the system may determine a value of the physical operating parameter that corresponds to a transition between the hardware component passing the fault test and failing the fault test, and therefore corresponds to the cutoff value. The value may be used to determine the degradation rate to the performance characteristic, such as by computing how much the performance characteristic has changed over the lifetime of the component and/or system. The degradation rate may also be computed using a measurement that indicates an operational duration the hardware component has operated, such as mileage of a vehicle, a runtime of the system and/or component, and/or a number of computations performed by the component.

In some embodiments, the degradation rate may be computed using at least one previous value of the physical operating parameter that is determined earlier in the lifetime of the hardware component, as well as corresponding values of the measurement. For example, the previous values may be determined similar to the value of the physical operating parameter, and the previous values may be used to periodically determine and monitor the degradation rate relative to a reference degradation rate. As another example, a previous value could be a predetermined value assigned to a start of the lifetime of the hardware component, such as a value the component was rated at when deployed on a computing platform.

Where it is determined that the degradation rate exceeds a reference degradation rate, one or more remedial actions may be performed. The reference degradation rate may, for example, correspond to an expected degradation rate for the component given the age of the component. For example, a reference degradation rate may be based on the measurement that indicates the operational duration the hardware component has operated up to a time when the degradation rate was determined. In some examples, values of the measurement may be divided into ranges and each range may use a same reference degradation rate. In some examples, the reference degradation rate may be computed using a function or model that determines the reference degradation rate based on a given measurement and/or other factors. As an example, reference degradation rates may be determined based on degradation rates of hardware component(s) that correspond to (e.g., have a shared design with or same design as) the hardware component at different times in the lifetimes of the components. For example, the reference degradation rates may be determined based on computing statistics on the degradation rates at different times and/or usage amounts for the components. In this way, the reference degradation rates that are used may correspond to what is typical or expected given how long and/or how much the hardware component has operated.

In further respects, when performing multiple instances of a fault test on a hardware component by applying different values of a physical operating parameter for each of the instances, the values may be determined based on one or more characteristics associated with the hardware component. As an example, the system may measure a temperature(s) of the hardware component (e.g., using an internal sensor of the hardware component) and use the temperature(s) to determine the values. As a further example, the system may additionally or alternatively determine an operational speed of the hardware component and use the operational speed to determine the values. The operational speed may, for example, be a hardcoded value that is read from memory and may be of an operational speed index that rates the operational speed of the hardware component against other hardware component(s) of a computing platform. By determining the values of the physical operating parameter based on the one or more characteristics, the system may account for variables that have an impact on the cutoff value of the physical operating parameter for the hardware component. For example, a minimum supply voltage of a hardware component may decrease with increasing temperature and/or operational speed. In some examples, the one or more characteristics are used to look up one or more of the different values used for fault testing in a table and/or to compute one or more of those values.

Various types of fault tests may be used to test various types of performance characteristics in accordance with the present disclosure. In some examples, one or more test parameters of the fault test are input to the hardware component to produce one or more outputs of the hardware component. The one or more outputs may include a logical output(s) and the hardware component may pass the fault test where the logical output(s) match an expected logical output(s). For example, logical outputs may be tested where the fault test includes a scan test performed at a certain frequency, such as a Fast Test Mode Scan (FTM2CLK). As a further example, logical outputs may be tested where the fault test includes a Built-In Self-Test (BIST) of a memory device, such as Memory BIST (MBIST). The scan test may be used, for example, where the cutoff value of the physical operating parameter corresponds to a minimum supply voltage.

In accordance with some aspects of the present disclosure, values of the physical operating parameter that are varied may be representative of an operating clock speed of the hardware component. Further, the cutoff value of the physical operating parameter for the hardware component may be a maximum operating clock speed of the hardware component. Using this approach, permanent faults may be predicted by detecting subtle gate defects in individual gates that may not typically be detectable. For example, a scan test may not be sensitive enough to detect, in a logic gate with multiple fins, degradation from damage to a single fin. These subtle gate defects can degrade over time to cause a permanent fault. By performing multiple instances of a scan test on the hardware component by applying different values of the operating clock speed to the hardware component, changes to the maximum operating clock speed may be detected to account for such subtle detects.

In further aspects of the present disclosure, in addition to or instead of a fault test evaluating a logical output(s) of the hardware component to distinguish between a pass or a fail of the fault test, a performance characteristic determined using a fault test may correspond to an electrical characteristic of an output (e.g., a non-logical output characteristic) of the hardware component. As an example, to predict a permanent electrical fault related to electrostatic discharge and electrical overstress, the fault test may be used to measure a leakage current at given values of physical operating parameters. In this example, the degradation rate may be evaluated with respect to the reference leakage current.

Aspects of the disclosure enable in-system testing of physical interfaces, such as Printed Circuit Board (PCB) interfaces with hardware component(s) at the system level. High speed interfaces—such as peripheral component interconnect express interfaces—can become faulty over time due to events such as reference clock jitter, PCB trace corrosion, and component I/O degradation. Aspects of the present disclosure allow for prediction of related permanent faults before they occur. In accordance with the present disclosure, such permanent faults may be predicted using a fault test that includes parametric testing of High Speed Interfaces (HSI)—via, for example and without limitation, eye diagrams—to determine a performance characteristic corresponding to margins in eye openings. In such examples, the degradation rate of the performance characteristic corresponds to changes in a margin(s) of an eye opening. In example embodiments, the parametric testing may include measuring and tracing the rate of change to the height and/or width of the eye openings in an eye diagram over time in order to determine whether to take one or more remedial actions.

Aspects of the present disclosure may further provide for predicting permanent faults using one or more machine learning models. For example, a machine learning model(s) may output prediction data representative of one or more confidence scores regarding one or more predictions of one or more permanent faults. According to example non-limiting embodiments, the machine learning model(s) may include a multi-parameter machine learning model. The multi-parameter machine learning model may continuously learn and improve IST failure predictability based on usage, environment, etc.

FIG. 1 illustrates an example computing platform 100 for predicting permanent faults in hardware components, in accordance with some embodiments of the present disclosure. It should be understood that this and other arrangements described herein are set forth only as examples. Other arrangements and elements (e.g., components, interfaces, functions, orders, systems, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. By way of example, the computing platform 100 and/or a degradation detection system 104 thereof may be implemented on one or more instances of the computing device 1000 of FIG. 10. Various functions described herein may be carried out by single or multiple hardware component(s), for example the degradation detection system 104 and hardware components 102A, 102B, and/or 102N may be implemented on one or more System-on-Chips (SoCs).

The present disclosure may be described with respect to the computing platform 100 be implemented on an example autonomous vehicle 900 (alternatively referred to herein as "vehicle 900" or "autonomous vehicle 900"), an example of which is described in more detail herein with respect to FIGS. 9A-9D. Although the present disclosure provides examples using autonomous vehicles, other types of objects and/or systems may implement the computing platform 100. For example, the systems and methods described herein may be used in high power computer servers, in augmented reality, virtual reality, robotics, and/or other technology areas.

The computing platform 100 may include, among other elements, the hardware component(s) 102A, 102B, and/or 102N (also referred to as hardware component(s) 102) and the degradation detection system 104. The degradation detection system 104 may include a test controller 122, a fault tester 106, a performance characteristic determiner 108, an operating parameter determiner 110, a test parameter determiner 112, a degradation rate determiner 114, a degradation rate analyzer 116, a remedial action manager 118, and a permanent fault predictor 120.

Examples of the hardware components 102 may include an integrated circuit, an SoC, a memory device, a logic circuit, a semiconductor chip, and/or other physical component or combination thereof. In at least some embodiments, the computing platform 100 may be implemented on an autonomous vehicle, such as the autonomous vehicle 900 of FIGS. 9A-9D, and the hardware components 102 may include components used to determine vehicle controls in an Advanced Driver Assistance System (ADAS) and/or autonomous driving system. Each of the hardware components 102 may be part of the same circuit and/or different circuits. Also, each of the hardware components 102 may be communicatively coupled to the degradation detection system 104.

Although the hardware components 102 may be described and shown as a plurality of hardware components, in at least some embodiments, the degradation detection system 104 may be used to detect degradation of a single hardware component, and/or the computing platform 100 may include any number of instances of the degradation detection system 104 and/or components thereof. In at least some embodiments, one or more instances of the degradation detection system 104 and/or portions thereof may be on a same Integrated Circuit (IC) as one or more of the hardware components 102. For example, a fault tester 106 may correspond to a Built-In Self-Test (BIST) of an IC and/or device that includes a corresponding hardware component 102, such as a memory device.

The degradation detection system 104 may be configured to detect the degradation of the hardware component(s) 102. The degradation detection system 104 may be communicatively coupled to the hardware components 102 (e.g., directly or indirectly), as shown, to carry out any of the various functionality described herein. In at least some embodiments, the degradation detection system 104 may be integrated with an IST system of the computing platform 100.

The test controller 122 of the degradation detection system 104 may be configured to orchestrate and control any of the various functionalities of the degradation detection system 104 described herein. To do so, the test controller 122 may use any combination of the components of the degradation detection system 104.

Figure 2:
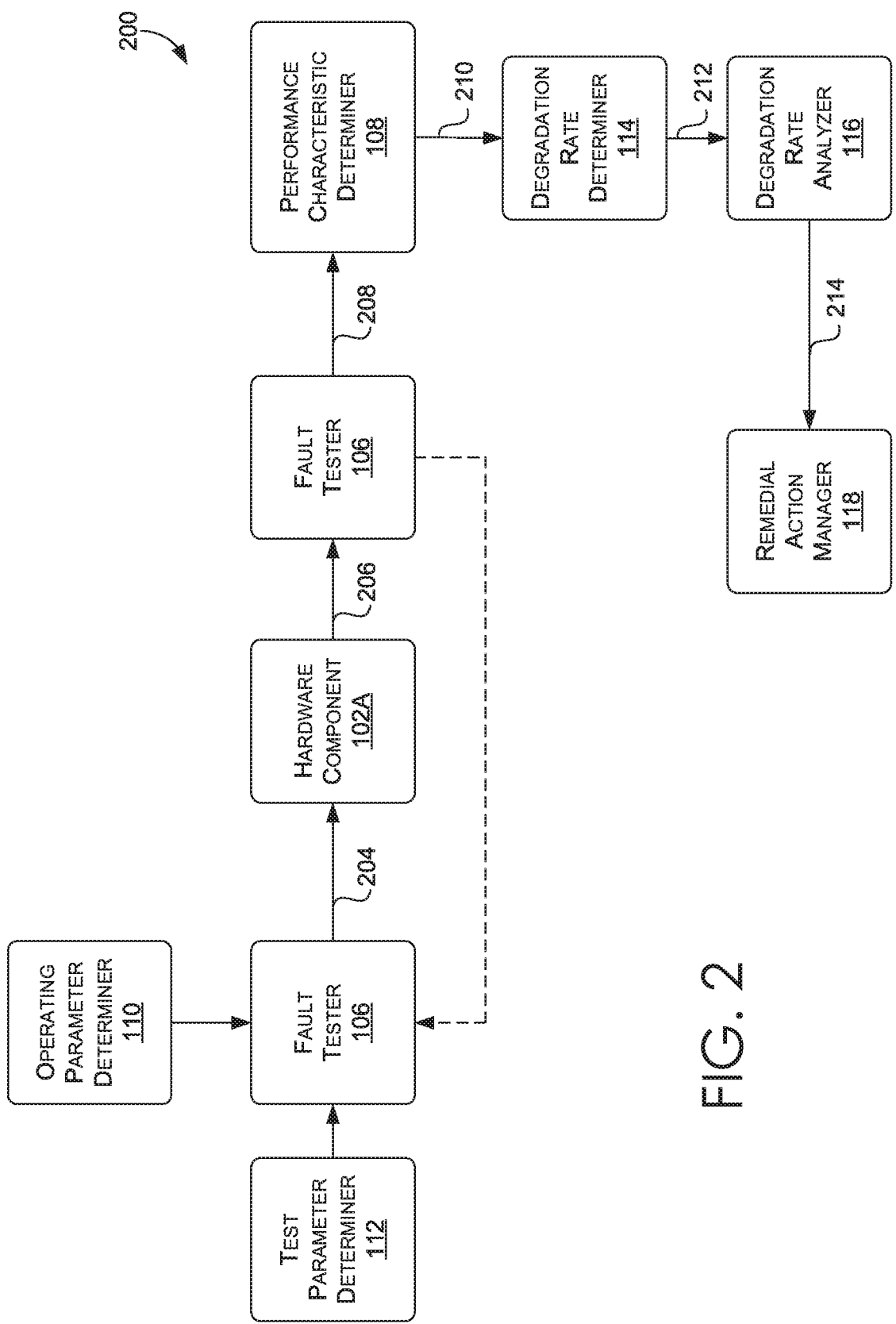
FIG. 2 is a flow diagram illustrating a process for predicting permanent faults in hardware components, in accordance with some embodiments of the present disclosure.

Referring to FIG. 2 with FIG. 1, FIG. 2 is a flow diagram illustrating a process 200 for predicting permanent faults in hardware components, in accordance with some embodiments of the present disclosure. As indicated in FIG. 2, the fault tester 106 of the degradation detection system 104 may be configured to perform fault tests on one or more of the hardware components 102, such as the hardware component 102A. In applying a fault test to the hardware component 102A, the degradation detection system 104 may use the operating parameter determiner 110 to determine one or more physical operating parameters to apply as inputs 204 to the hardware component 102A during the fault test and/or test parameter determiner 112 to determine one or more test parameters to apply as the inputs 204 to the hardware component 102A during the fault test. As a result, the hardware component 102A may produce one or more outputs 206 and the fault tester 106 may determine a result(s) 208 of the fault test based at least in part on measuring and/or evaluating the outputs 206. As indicated in FIG. 2, in at least some embodiments, the fault test may be repeated for multiple instances, and the results 208 may be based on the results for the multiple instances.

The performance characteristic determiner 108 may be used to determine a value(s) 210 of a performance characteristic of the hardware component 102A based on the fault test of the hardware component 102. The degradation rate determiner 114 may be configured to determine a degradation rate 212 of the performance characteristic the hardware component 102 based at least in part on the value(s) 210 of the performance characteristic (e.g., based on a change to values of the performance characteristic over time). The degradation rate analyzer 116 may be configured to analyze the degradation rate 212 of the performance characteristic, such as based on comparing the degradation rate to a reference degradation rate, to produce analysis results 214. The remedial action manager 118 may be configured to perform one or more remedial actions based at least in part on the analysis results 214 of the degradation rate determiner 114 (e.g., based on a determination the degradation rate exceeds the reference degradation rate).

Although not shown in FIG. 2, in at least one embodiment, the permanent fault predictor 120 may be configured to predict a permanent fault in the hardware component 102 based at least in part on any of a variety of input signals and/or data of the computing platform 100, such as data corresponding to the degradation rate of the hardware component. In at least one embodiment, the remedial action manager 118 may perform one or more remedial actions based at least in part on a prediction(s) (e.g., based on one or more confidence scores) of the permanent fault predictor 120. In at least one embodiment, the permanent fault predictor 120 may be used with the remedial action manager 118 independent from the process 200.

The fault tester 106 of the degradation detection system 104 may be configured to perform fault tests on one or more of the hardware components 102. In carrying out a fault test, the fault testing 106 may apply one or more operating conditions, test parameters, physical operating parameters and/or other inputs to one or more of the hardware components. The input(s) to the hardware component(s) 102 may cause the hardware component(s) 102 to determine and/or produce one or more outputs, such as the outputs 206. The one or more outputs of the hardware component(s) may correspond to a result(s) (also referred to as "results") and/or be used to determine results of the fault test, such as the results 208.

In at least one embodiment, results of a fault test on a hardware component(s) 102 includes data representative of whether the hardware component(s) 102 passed or failed the fault test. For example, the fault tester 106 may include hardware and/or software for testing the hardware component(s) 102 and evaluating one or more outputs of the hardware component(s) to determine a pass or a failure of the fault test. The one or more outputs that are evaluated may include one or more logical outputs and/or one or more physical outputs (e.g., current level, voltage level, resistance level, etc.). In embodiments where the fault tester 106 evaluates one or more logical outputs, the hardware component(s) 102 may determine a pass of an instance of a fault test based at least in part on the fault tester 106 determining the logical output(s) match an expected logical output(s). Also, in embodiments where the fault tester 106 evaluates one or more logical outputs, the hardware component(s) 102 may determine a failure of an instance of a fault test based at least in part on the fault tester 106 determining the logical output(s) fail to match an expected logical output(s).

For example, the fault tester 106 may test logical outputs where a fault test includes a scan test performed while operating a hardware component 102 (e.g., comprising one or more logic gates that produce the logical outputs) at a certain operating frequency, such as a Fast Test Mode Scan (FTM2CLK). As a further example, the fault tester 106 may test logical outputs where the hardware component(s) 102 includes a memory device and a fault test include a BIST, such as a Memory BIST (MBIST).

In embodiments where the fault tester 106 evaluates one or more physical outputs, the hardware component(s) 102 may measure one or more output(s) of the hardware component(s) 102 to determine a pass of an instance of a fault test based at least in part on the fault tester 106 determining one or more of the physical output(s) exceed or fail to exceed a threshold value. Also, in embodiments where the fault tester 106 evaluates one or more physical outputs, the hardware component(s) 102 may measure one or more output(s) of the hardware component(s) 102 to determine a failure of an instance of a fault test based at least in part on the fault tester 106 determining one or more of the physical output(s) exceed or fail to exceed a threshold value. For example, the fault tester 106 may determine a failure of a fault test where leakage current from the hardware component(s) 102 exceeds a threshold value. In at least one embodiment, the fault tester 106 may not evaluate one or more outputs of the hardware component(s) 102 from a fault test. Also in at least one embodiment, a result(s) of a fault test, such as the results 208, includes or corresponds to a level (e.g., measured value) of a physical output(s) of the hardware component(s) resulting from the fault test. For example, a result of a fault test may include a leakage current level of the hardware component(s) 102.

A test parameter may refer to an input that the fault tester 106 applies to a hardware component(s) 102 for an instance of a fault test that impacts one or more expected outputs of the hardware component(s) 102 that are evaluated by the fault tester 106 to determine a pass or a fail of the fault test. For example, criteria used by the fault tester 106 to evaluate whether an output(s) results in a pass or a fail of the fault test may depend on what test parameter(s) are applied to the hardware component 102. One or more test patterns of a BIST are examples of test parameters of a fault test. Other examples of test parameters of a fault test are one or more test sequences of a scan test. A further example of a test parameter is one or more physical inputs to the hardware component(s) 102 that impacts criteria used by the fault tester 106 to evaluate whether an output(s) result in a pass or a fail of the fault test, such as what threshold value(s) are compared against a physical output level(s).

A physical operating parameter may refer to an input(s) provided to a hardware component(s) 102 that controls operating conditions under which the hardware component(s) 102 produces one or more outputs of a fault test without impacting one or more expected outputs of the hardware component(s) 102 that are evaluated by the fault tester 106 to determine a pass or a fail of the fault test. An example of a physical operating parameter is a supply voltage applied to a hardware component 102 during a BIST, which does not impact the criteria the fault tester used to judge whether the hardware component 102 passed or failed the BIST. For example, the hardware component 102 may be capable of producing a correct output(s) for each instance of a fault test at increasing or decreasing values of a physical operating parameter applied during instances of the fault test until a certain value is reached, at which point the hardware component 102 may begin producing an incorrect output(s) from instances of the fault test. Such a value may correspond to a cutoff value (e.g., Vmin) of the physical operating parameter at which the hardware component is capable of passing the fault test.

In at least one embodiment, the fault tester 106 may run multiple instances of a fault test to determine a degradation rate to a performance characteristic of the hardware component(s) 102. Each instance of the fault test may include an application of one or more physical operating parameters and/or one or more test parameters to generate one or more outputs of the hardware component(s) 102. In various examples, multiple instances of the fault test may use the same physical operating parameters and/or test parameters, and/or at varying physical operating parameters and/or test parameters. In doing so, the fault tester 106 may use the operating parameter determiner 110 to determine what physical operating parameter(s) to apply and the test parameter determiner 112 to determine what test parameter(s) to apply to the hardware component(s) 102.

Referring now to FIG. 3, FIG. 3 presents an example table 300 capturing aspects of performing multiple instances of a fault test on a hardware component. The table of FIG. 3 shows test stages 302, 304, 306, 308, and 310 represented as columns of the table 300. Also shown in FIG. 3 are test runs 316, 318, 320, and 322 represented as rows of the table 300. A test run performed by the degradation rate system 104 may include one or more test stages and the process 200 of FIG. 2 may be performed for each test run. In at least one embodiment, results of a test run include or a based on one or more results of each test stage. In such examples, the results 208 of FIG. 2 may correspond to a set of results of test stages performed in a test run. In at least one embodiment, the process 200 of FIG. 2 may correspond to a single test run and a plurality of test stages.

In accordance with embodiments of the present disclosure, a test stage may include one or more instances of the fault tester 106 performing and determining results of a fault test. Within a test stage, each instance of the fault test may apply a same input set to the hardware component(s) 102 being tested. Further, where the fault tester 106 evaluates whether the hardware component(s) 102 passes or fails the fault test, the fault tester 106 may use a same set of evaluation criteria to evaluate outputs(s) of the hardware component(s) 102 in order to determine a pass or a fail. However, across test stages, one or more of test parameters and/or physical operating parameters applied to the hardware component(s) 102 may be different. For example, in FIG. 3, V1, V2, V3, V4, and Vsafe of the test stages 302-310 represent different values of physical operating parameters that are applied during a corresponding test stage, which increases in value from left to right. In at least one embodiment, test parameters that are applied during each state may remain fixed.

In FIG. 3, each test run 316-322 includes an instance of the fault tester 106 performing each of test stages 302-310, with a top cell of a particular instance and test stage representing a value of a physical operating parameter that is applied in the test stage and a bottom cell representing results of individual instances of the fault test within the test stage. For example, the test run 318 includes an instance 328 of the test stage 304 and a cell 330A represents a value of a physical operating parameter that is applied during the instance 328 (e.g., 470 millivolts) and a cell 330B representing results of individual instances of the fault test within the test stage 304 for the instance 328.

In at least one embodiment, the fault tester 106 produces a result of a test stage from the results of the multiple instances of the fault test within the test stage. A result of a test stage may be more stable when it is based on multiple instances of a fault test, rather than a single instance, which may enhance the stability of the degradation detection system 104 in at least some embodiments. For example, test stages 302-310 in FIG. 3 each include five iterations of performing a fault test, with individual results of a fault test being represented in the table 300 with an "F" or a "P." An "F" represents a failure of an instance of a fault test and a "P" represents a pass of the fault test as determined by the fault tester 106. Thus, in the instance 328 of the test stage 304, the hardware component(s) 102 may have failed the fault test twice, then passed the fault test three times.

In at least one embodiment, the fault tester 106 determines a result of a test stage is a pass based at least in part on a majority of the instances of the fault test within the test stage resulting in a pass, and may determine a failure based at least in part on a majority of the instances of the fault test within the test stage resulting in a failure. For example, the instance 328 may be determined as a pass for the test stage 304. In embodiments where results of a fault test include or correspond to one or more levels of physical outputs of the hardware component(s), a result(s) of an instance of the value for a test stage may be based at least in part on one or more statistical values computed by the fault tester from the individual physical output levels of the multiple instances of the fault test (e.g., an average, a mode, a median, etc.).

As described herein, results of a test run (e.g., the results 208 of FIG. 2), such as the test run 318 may correspond to results of one or more test stages of the test run. The performance characteristic determiner 108 may determine a performance characteristic of the hardware component(s) 102 based at least in part on the results of a test run. As described herein, the performance characteristic may correspond to a cutoff value of a physical operating parameter at which a hardware component 102 is capable of passing a fault test.

The performance characteristic determiner 108 may analyze the results of the multiple instances of the fault test of a test run to detect and/or estimate the cutoff value based at least in part on a value of the physical operating parameter at which the hardware component 102 transitions from a passing of the fault test to a failing of the fault test (e.g., at different test stages). For example, in the test run 318 of FIG. 3, a value of the physical operating parameter applied during the fault test increases from test stage 302 to 310. Between test stages 302 and 304, the hardware component 102 transitions from failing the fault test to passing the fault test, then continues to pass the fault test as the value of the physical operating parameter is further increased. As such, the cutoff value (e.g., a Vmin) of the physical operating parameter (e.g., a supply voltage) for the hardware component 102 may be, for example, less than or equal to 470 millivolts and 440 millivolts.

In at least one embodiment, the performance characteristic determiner 108 may determine the value corresponding to the cutoff value as the value applied at the test stage where the hardware component 102 transitions to a pass of the fault test (e.g., 470 millivolts), or some value between the pass and the fail values, such as an average of values applied at test stages 302 and 304 (e.g., 455 millivolts). Although an example of a supply voltage is provided, a performance characteristic may correspond to one or more other types or physical operating parameters.

As indicated in FIG. 3, the degradation detection system 104 may perform any number of test runs over time. Each test run may correspond to a different operational duration a hardware component 102 has operated up to the degradation detection system 104 executing a test run. For example, test runs may be executed periodically and/or at irregular times or intervals. In at least one embodiment, the degradation rate system 104 executes a test run based at least in part on a measurement that indicates or corresponds to an operational duration the hardware component 102 has operated, such as a stance travelled (e.g., mileage) by a vehicle or other object that hosts the computing platform 100, a runtime of the computing platform 100, and/or the hardware component 102, and/or a number of computations and/or operations performed by the hardware component 102.

For example, FIG. 3 indicates a mileage of 0 kilometers at test run 316, 100 kilometers at test run 318, 1,000 kilometers at test run 320, and 10,000 kilometers at test run 322. While test runs 316-322 are shown, any number of intervening test runs may have been performed by the degradation detection system 104, which are not shown. In at least one embodiment, the degradation rate determiner 114 may determine a degradation rate for each test run based at least in part on a value(s) of a performance characteristic for the test run (determined by the performance characteristic determiner 108) and one or more previous values of the performance characteristic. The one or more previous values may be from one or more previous test runs. Further, the degradation rate may correspond to an amount of change to the performance characteristic relative to an elapsed time or operational duration.

As an example, when the degradation rate determiner 114 is used to determine a degradation rate for the test run 320, a performance characteristic for FIG. 3 may correspond to a cutoff value (e.g., Vmin) of the physical operating parameter at which the hardware component is capable of passing the fault test. As described herein, for the test run 318, the performance characteristic determiner 108 may determine 470 millivolts as a value of the performance characteristic. Using a similar approach, for the test run 320 the performance characteristic determiner 108 may determine 580 millivolts as a value of the performance characteristic. For example, at the test run 320, the transition between a pass and a fail corresponds to test stages 306 and 308, indicating the cutoff value has degraded overtime, as the hardware component 102 needs a higher voltage to pass the fault test. In at least one embodiment, the degradation rate determiner 114 may compute the degradation rate for the test run 320 as a difference between the value of the performance characteristic divided by a difference between measurements indicating operational durations the hardware component 102 has operated up to the test runs 318 and 320. In the example provided, the degradation rate may be (580 mV−470 mV)/(1000 km−100 km)=approximately 0.12 mv/km.

The degradation rate determiner 114 may similarly determine degradation rates for different test runs and the degradation rate analyzer 116 may analyze any of the various degradation rates in order to monitor the degradation rates over time. In at least one embodiment, the degradation rate analyzer 116 may be configured to analyze a degradation rate(s) of a performance characteristic, such as based on comparing a degradation rate to a reference degradation rate, to produce analysis results. The reference degradation rate may correspond to a typical degradation rate for an age and/or usage amount of the hardware component 102, and/or for a hardware component that is not at risk of developing an imminently developing a permanent fault. Different reference degradation rates may be used for comparison against different degradation rates, such as based on the measurement(s) that indicates an operational duration the hardware component 102 has operated (e.g., determined by applying the measurement to a lookup table or a function), and/or a same degradation rate may be used for different. For example, a same degradation rate may be used to monitor short term degradation rates, whereas different degradation rates may be used to monitor longer term degradation rates that correspond to the age and/or usage (e.g., a total age and/or usage) of hardware component 102. A short term degradation rate may be useful for identifying a hardware component close to a permanent fault, and a longer term degradation rate may be useful for identifying an abnormal hardware component.

The analysis results 214 may include one or more signals and/or indicators that one or more degradation rates have been exceeded and one or more remedial actions performed by the remedial action manager 118 may be based at least in part on a type of reference degradation rate that has been exceeded (e.g., short vs. long term), a number of degradation rates that have been exceeded, and/or other factors. For example, an action for a longer term reference degradation rate being exceeded may include causing a check engine light to turn on and/or indicating a part should be replaced. An action for a short term reference degradation rate being exceeded may include causing one or more functions that correspond to the hardware component 102 of an autonomous vehicle to be disabled, such as autonomous driving, until a part is replaced.

Various types of remedial actions are contemplated as being initiated by the remedial action manager 118. Examples include disabling one or more functions of the computing platform 100, such as a function that is effectuated using the hardware component 102. In embodiments where the computing platform 100 is an automated driving system of the vehicle 900 of FIGS. 9A-9D, the one or more remedial actions may include disabling autonomous driving of the vehicle 900 and/or one or more ADAS features. Further examples of remedial actions include causing presentation of an indicator(s) of the degradation rate(s) exceeding the reference degradation rate(s). The indicator may include an indication on a dashboard and/or instrument panel of the autonomous vehicle 900, for example a "check engine" light, a message on a screen or heads-up display (e.g., of the vehicle 900 of FIGS. 9A-9D), etc. Other examples include audible indicators such as an audible alert, an automated scheduling of a repair service for the computing platform 100, automated controls of the autonomous vehicle 900 (e.g., to pull the vehicle over to the side of the road or to drive to a particular venue such as a repair facility), etc. Further examples of remedial actions include flagging or creating a record in a log of the computing platform 100, such as a system log and/or file.

In accordance with further aspects of the present disclosure, the operating parameter determiner 110 may determine a value(s) of a physical operating parameter(s) for a fault test based at least in part on one or more characteristics associated with the hardware component(s) 102. As an example, the operating parameter determiner 110 may use a measurement of a temperature(s) of a hardware component 102 and use the temperature(s) to determine the value(s). In at least one embodiment, the measurement may be from an internal sensor of the hardware component 102 and/or associated with the hardware component 102 on an IC. The operating parameter determiner 110 may initiate a measurement of a temperature reading and/or sample a temperature reading(s) (e.g., from a register) to determine a temperature(s) of the hardware component 102.

A further example of one or more characteristics that may be used by the operating parameter determiner 110 to determine a value(s) of one or more physical operation parameters may include an operational speed of the hardware component(s) 102. An operational speed may, for example, be a hardcoded value that is read from memory by the operating parameter determiner 110 and may be of an operational speed index that rates the operational speed of a hardware component 102 against other hardware components 102 (e.g., ICs) of the computing platform 100. An example of an operational speed index is NVIDIA's Speedo. In at least one embodiment, an operational speed value is based at least in part on performance of one or more ring oscillators within a die, which may be tested and stored in association with the die prior to deployment on the computing platform 100.

By determining the value(s) of a physical operating parameter(s) used for fault testing based on the one or more characteristics, the operating parameter determiner 110 may account for variables that have an impact on the performance characteristic(s) for a hardware component 102, but may not necessarily indicate a latent detect. For example, for the same hardware component 102 or hardware component class, a minimum supply voltage of the hardware component 102 may decrease with increasing temperature and/or operational speed. In some examples, the one or more characteristics are used to lookup one or more of the different values used for fault testing in a table and/or to compute one or more of those values (e.g., using a function). For example, where a value of a physical operating parameters is computed, an initial value may be provided that is adjusted based at least in part on the one or more characteristics.

Figure 4:
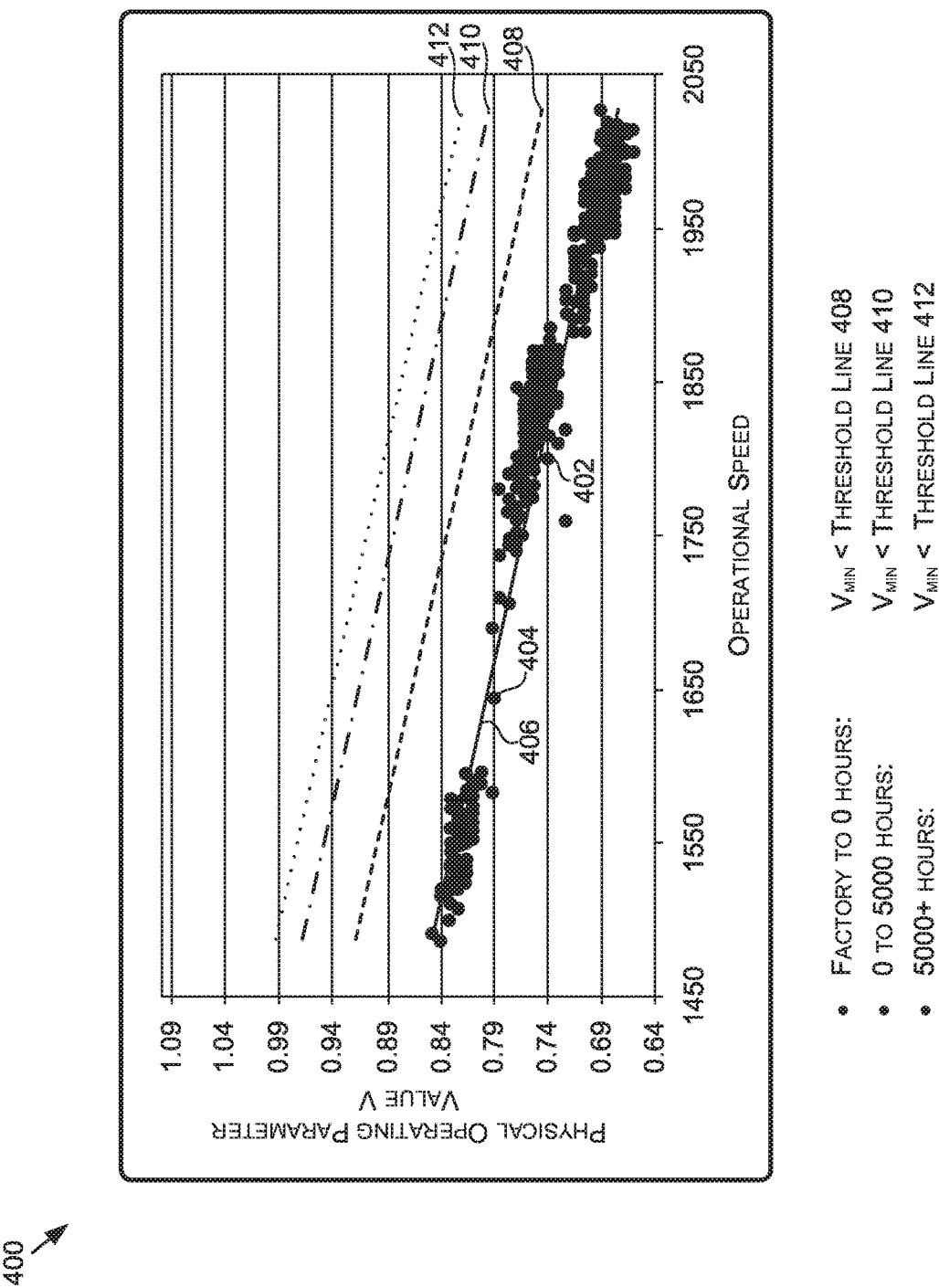
FIG. 4 is a graph illustrating relationships between operational speed of hardware components and cutoff values of a physical operating parameter, in accordance with some embodiments of the present disclosure.

FIG. 4 is a graph 400 illustrating relationships between the operational speed of hardware components and cutoff values of a physical operating parameter, in accordance with some embodiments of the present disclosure. Each point in the graph 400, such as points 402 and 404 may represent a cutoff value of a respective hardware component that is tested prior to deployment on a computing platform, such as at a factory, or early in deployment on a computing platform, such as the computing platform 100. In at least some embodiments, the cutoff value of each hardware component may be determined using approaches described herein (e.g., using an instantiation of the degradation detection system 104 and a test run(s), which may or may not be on the computing platform 100). As shown, the point 402 may correspond to a hardware component 102 with an operational speed of 1800 and a cutoff value of 0.74 V. The point 404 may correspond to a hardware component 102 with an operational speed of 1650 and a cutoff value of 0.79 V. A threshold line 406 is fit to the points of the graph 400 showing that as the operational speed increases, the cutoff value tends to decrease.

The operating parameter determiner 110 may leverage the relationship of the graph 400 in determining a value(s) of a physical operating parameter(s) for a fault test, allowing the cutoff value to be identified in fewer iterations of the fault test and to be accounted for in determining the degradation rate. For example, referring to FIG. 3, the table 300 shows an operational speed of 1622, which the operating parameter determiner 110 may use to derive the values of the physical operating parameter in the table 300.

Also in the table 300, the operating parameter determiner 110 uses the temperature reading shown in the table, resulting in the values of the physical operating parameter being different for different test runs. For example, a temperature of 45 degrees Celsius results in a value of 460 mV for the test run 316 at the test stage 302 and a temperature of 75 Celsius results in a value of 440 mV for the test run 318 at the test stage 302. As described herein, the temperature, operational speed, and/or other characteristics may be captured in a table the operating parameter determiner 110 uses to lookup values of physical operating parameters for the test stages 302-310 and/or compute the values.

Returning to FIG. 4, the graph 400 shows threshold lines 406, 408, 410, and 412, which may correspond to applied values of the physical operational parameter at the test stages 302, 304, 306, and 308 respectively and/or reference degradation rate values. The threshold lines 408, 410, and 412 may correspond to thresholds on cutoff values of the hardware components that correspond to the points in the graph 400 at different operational durations after deployment and may be offset from the threshold line 406 to capture degradation of the hardware components over time. In at least one embodiment, the degradation rate analyzer 116 determines a hardware component 102 includes a latent defect if the performance characteristic (the cutoff value in this case) is too high for the age and/or usage amount of the hardware component 102 to trigger one or more remedial actions by the remedial action manager 118, as described herein.

As indicated in FIG. 4, at initial deployment, the degradation rate analyzer 116 may determine the hardware component 102 includes a latent defect if the cutoff value exceeds a corresponding value on the threshold line 408 upon or before deployment. The degradation rate analyzer 116 may determine the hardware component 102 includes a latent defect if the cutoff value exceeds a corresponding value on the threshold line 410 from deployment to 5000 hours of operation. The degradation rate analyzer 116 may determine the hardware component 102 includes a latent defect if the cutoff value exceeds a corresponding value on the threshold line 412 from deployment to 5000 hours of operation and on. Although hours of operation is shown in FIG. 4, another form of measurement of usage or age of hardware components may be used.

In at least one embodiment, the degradation rate determiner 114 provides the degradation rate analyzer 116 with a measurement of usage or age of a hardware component 102, as well as the value(s) of the performance characteristic derived from a test run(s). The degradation rate analyzer 116 uses the measurement to compute and/or lookup a reference degradation rate value(s) and determines whether the value(s) of the performance characteristics exceeds the reference degradation rate value(s). If the degradation rate analyzer 116 determines the reference degradation rate value(s) is exceeded, an indication may be included in analysis results (e.g., the analysis results 214) provided to the remedial action manager 118 to initiate one or more actions described herein.

While FIG. 3 uses a supply voltage as an example of a physical operating parameter that may be varied for instances of fault tests, one or more other types of physical operating parameters may be used in addition to or instead of a supply voltage. Examples include values of a supply current, an input resistance, an input impedance, or an operating clock speed. In accordance with aspects of the disclosure, a scan mode test, such as a Fast Scan Mode (e.g., FTM2CLK) test for logical gates may be used to detect subtle gate defects, even if they are to individual gates. The subtle gate defects can degrade over time to cause a permanent fault, which may be predicted using approaches described herein. This can be achieved, for example and without limitation, by closing FTM2CLK specific timing independent of functional timing during an IC design process, so that FTM2CLK is sensitive to subtle time zero defects. In embodiments, values of an operating clock speed may be varied across test stages of a test run to determine a cutoff value corresponding to the operating clock speed (e.g., using approaches described with respect to FIG. 3 including evaluating a pass or a fail of fault tests).

Embodiments of the present disclosure may be used to test physical interfaces, such as Printed Circuit Board (PCB) interfaces, peripheral component interconnect express (PEX) interfaces, or High speed Serial Interface (HSI) interfaces of hardware component(s) of a computing platform. High speed interfaces can become faulty over time due to events such as reference clock jitter, PCB trace corrosion, and component I/O degradation. Aspects of the present disclosure allow for prediction of permanent faults to physical interfaces before they occur. In accordance with the present disclosure, such permanent faults may be predicted where the fault tester 106 uses a fault test that includes parametric testing of High Speed Interfaces (HSI)—via, for example and without limitation, eye diagrams—to determine a pass or a failure based on margins in eye openings. In such examples, the performance characteristic may correspond to a margin(s) of an eye opening. The degradation rate may correspond to a rate of change of the margin(s) of the eye opening. In example embodiments, the parametric testing may include measuring and tracing the rate of change to the height and/or width of the eye openings in an eye diagram over time in order to determine whether to take one or more remedial actions.

Figure 5A:
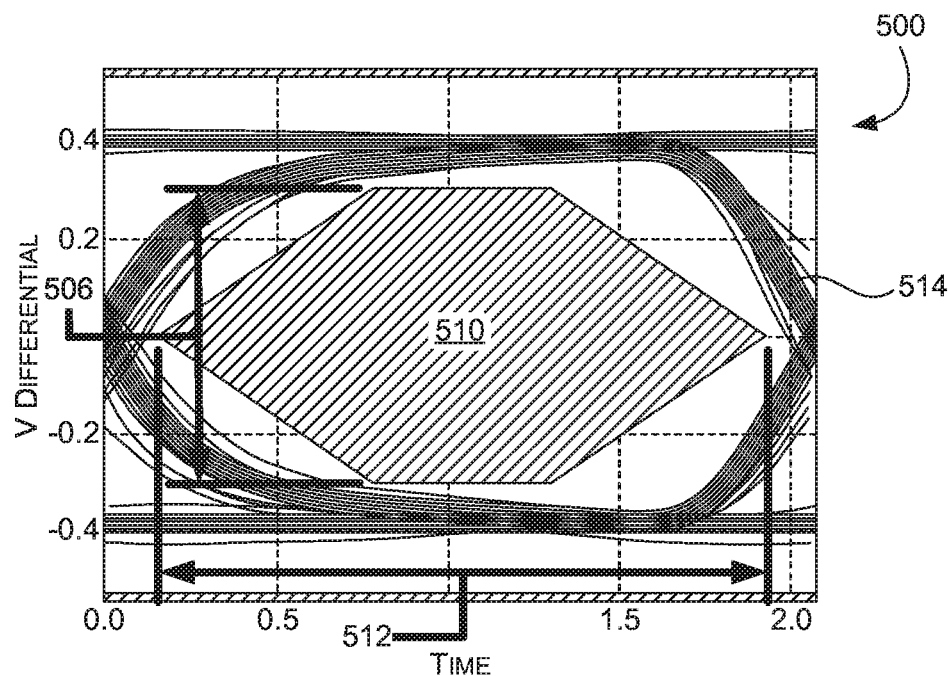
FIG. 5A is an example of an eye diagram for a physical interconnect of a hardware component, in accordance with some embodiments of the present disclosure.
Figure 5B:
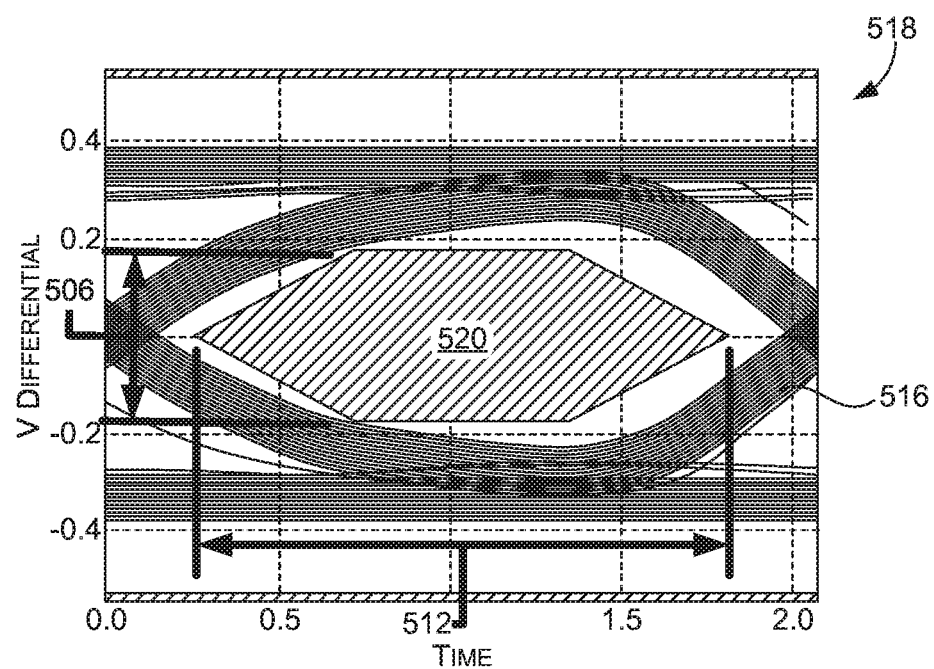
FIG. 5B is an example of an eye diagram for the physical interconnect of the hardware component of FIG. 5A with degradation to a performance characteristic, in accordance with some embodiments of the present disclosure.

Referring now to FIGS. 5A and 5B, FIG. 5A is an example of an eye diagram 500 for a physical interconnect of a hardware component 102, in accordance with some embodiments of the present disclosure. FIG. 5B is an example of an eye diagram 518 for the physical interconnect of the hardware component 102 of FIG. 5A with degradation to a performance characteristic, in accordance with some embodiments of the present disclosure.

The eye diagram 500 may correspond to an output(s) 514 of the hardware component 102 for a test run performed by the fault tester 106. The eye diagram 518 may correspond to an output(s) 516 of the hardware component 102 for a test run performed by the fault tester 106 at a later time. The eye diagram 500 includes an eye opening 510 formed by the outputs 514. Similarly, the eye diagram 518 includes an eye opening 520 formed by the outputs 516. In FIGS. 5A and 5B, dimensions of the eye opening 520 are different than dimensions of the eye opening 510, due to degradation to a physical interconnect. In at least one embodiment, the value(s) of a performance characteristic(s) determined by the performance characteristic determiner 108 corresponds to one or more measurements of one or more dimensions of the eye openings 510 and 520. For example, the fault tester 106 may measure a height 506 and/or a width 512 of the eye openings 510 and 520 to compute or determine one or more values of one or more performance characteristics and the results 208 may correspond to one or more of those measurements. The degradation rate determiner 114 may use the value(s) of the performance characteristic(s) to determine a degradation rate of the physical interconnect of the hardware component 102, as described herein.

In at least one embodiment, the fault tester 106 may use a same set of physical operating parameter values to a test a physical interface(s), which may be applied using a single test stage per test run. In other examples, multiple test stages and varying values of physical operating parameters may be used to determine a cutoff value performance characteristic, as described herein. Further, the results 208 from the fault tester 106 may or may not include a pass or a fail of the fault test and may or may not include measurements of a physical output(s) of the hardware component 102. For example, in embodiments where the fault tester 106 evaluates a measurement(s) for a pass or a fail, this may involve determining whether one or more measurements or a combination thereof exceed a threshold value(s). As another example, the one or more measurements or a combination thereof may be used as values of a performance characteristic(s).

In further aspects of the present disclosure, to predict a permanent electrical fault related to electrostatic discharge and electrical overstress, a fault test performed by the fault tester 106 may include a leakage current test where a value of the performance characteristic corresponds to the leakage current from a hardware component 102 with a given value(s) of a physical operating parameter. In this example, a value(s) of a physical operating parameter(s) applied to the hardware component 102 may be substantially fixed for each time the fault test is run to determine the value(s) of the performance characteristic. In at least one embodiment, the value(s) of the performance characteristic may correspond to a measurement of the leakage current. In embodiments where the fault tester 106 evaluates a measurement(s) for a pass or a fail, this may involve determining whether one or more measurements or a combination thereof exceed a threshold value(s). As another example, the one or more measurements or a combination thereof may be used as values of a performance characteristic(s). Results of a leakage current test may be expected to decrease over time, in at least one embodiment, the degradation rate analyzer 116 may provide an indication in the analysis results 214 if the degradation rate analyzer 116 identifies an increase in the leakage current so that the remedial action manager 118 may take one or more of the various actions described herein.

Aspects of the present disclosure may further provide for the degradation detection system 104 predicting permanent faults using one or more machine learning models. For example, the degradation detection system 104 includes permanent fault predictor 120, which may output prediction data representative of one or more confidence scores regarding one or more predictions of one or more permanent faults.

Figure 6:
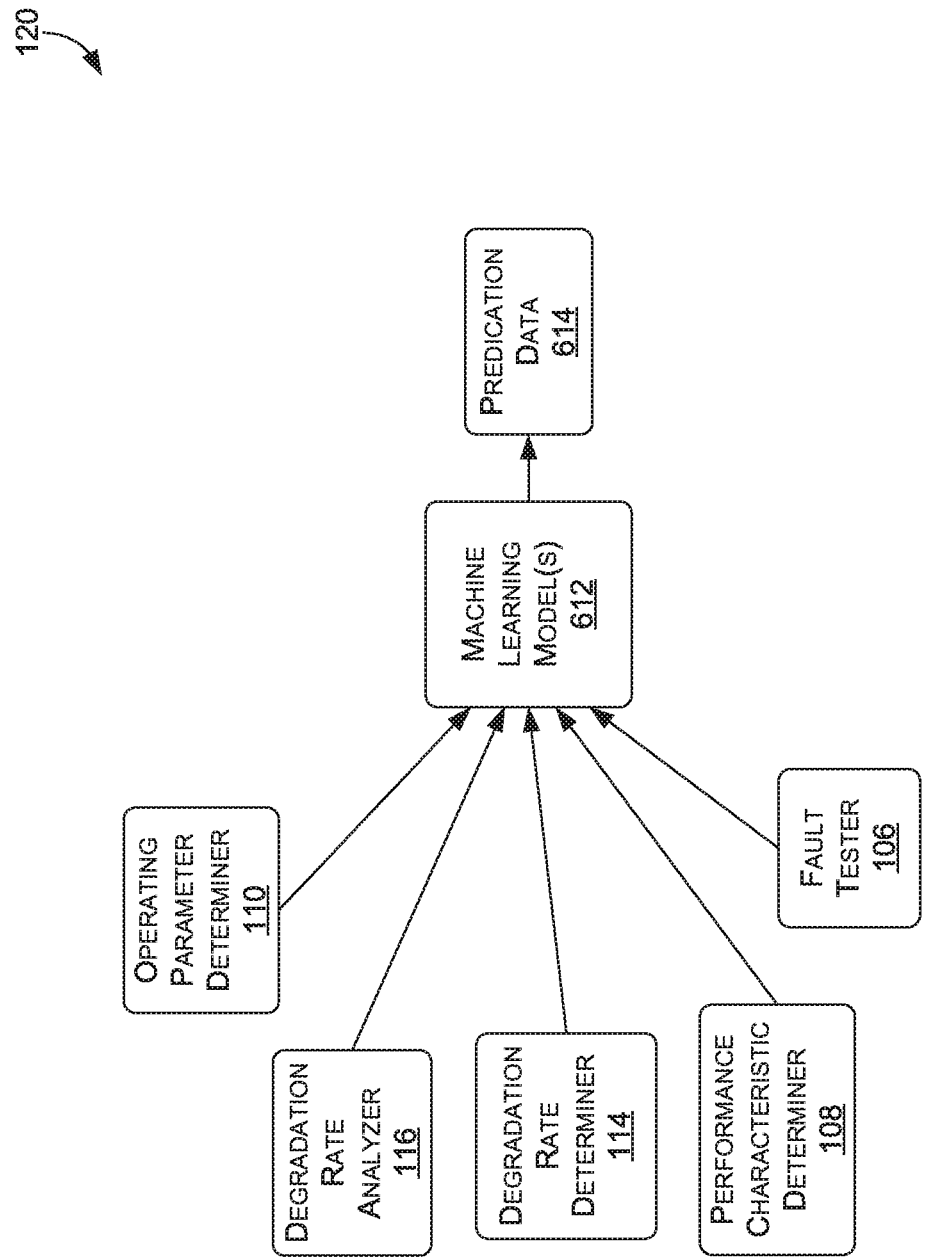
FIG. 6 is an illustration including an example machine learning model(s) of a permanent fault predictor, in accordance with some embodiments of the present disclosure.

Now referring to FIG. 6, FIG. 6 is an illustration including an example machine learning model(s) 612 of the permanent fault predictor 120, in accordance with some embodiments of the present disclosure. The machine learning model(s) 612 of FIG. 6 may be one example of a machine learning model(s) 612 that may be used in the permanent fault predictor 120. The machine learning model(s) 612 may include one or more of any type of machine learning model, such as a machine learning model(s) using linear regression, logistic regression, decision trees, support vector machines (SVM), Naïve Bayes, k-nearest neighbor (Knn), K means clustering, random forest, dimensionality reduction algorithms, gradient boosting algorithms, neural networks (e.g., auto-encoders, convolutional, recurrent, perceptrons, Long/Short Term Memory (LSTM), Hopfield, Boltzmann, deep belief, deconvolutional, generative adversarial, liquid state machine, etc.), and/or other types of machine learning models.

For example, the convolutional neural network may use inputs that include data from any of the components and functions of the computing platform 100. For example, and as illustrated in FIG. 6, the operating parameter determiner 110, performance characteristic determiner 108, and fault tester 106 and/or other inputs may be submitted to the machine learning model(s) 612. Data may be input to the machine learning model(s) 612 in a convolutional stream of a convolutional network. The convolutional stream may include any number of layers and one or more layers may include an input layer.

The machine learning model(s) 612 may use one or more of any combination of the various data collected by the computing platform 100, and/or generated by one or more components of the degradation detection system 104 and associated with a hardware component(s) 102, such as any of the various degradation rates, fault test results, values of performance characteristics, indicators of in analysis data of degradation rates, etc. Further examples include error code correction (ECC) data, usage data (e.g., corresponding to a measurement of usage and/or age of the hardware component and/or the computing platform 100), and/or environment data (e.g., corresponding to one or more measurements of the environment, such as pressure, temperature, humidity, etc.). According to example non-limiting embodiments, the machine learning model(s) 612 includes a multi-parameter machine learning model. The multi-parameter machine learning model may continuously learn and improve IST failure predictability based on usage, environment, etc. As shown, the machine learning model(s) 612 may generate prediction data 614 representative of one or more confidence scores regarding one or more predictions of one or more permanent faults.

In at least one embodiment, the remedial action manager 118 may initiate one or more of any of the various actions described herein based at least in part on the prediction data 614, such as based at least in part on determining one or more confidence scores exceed a threshold value(s).

Figure 7:
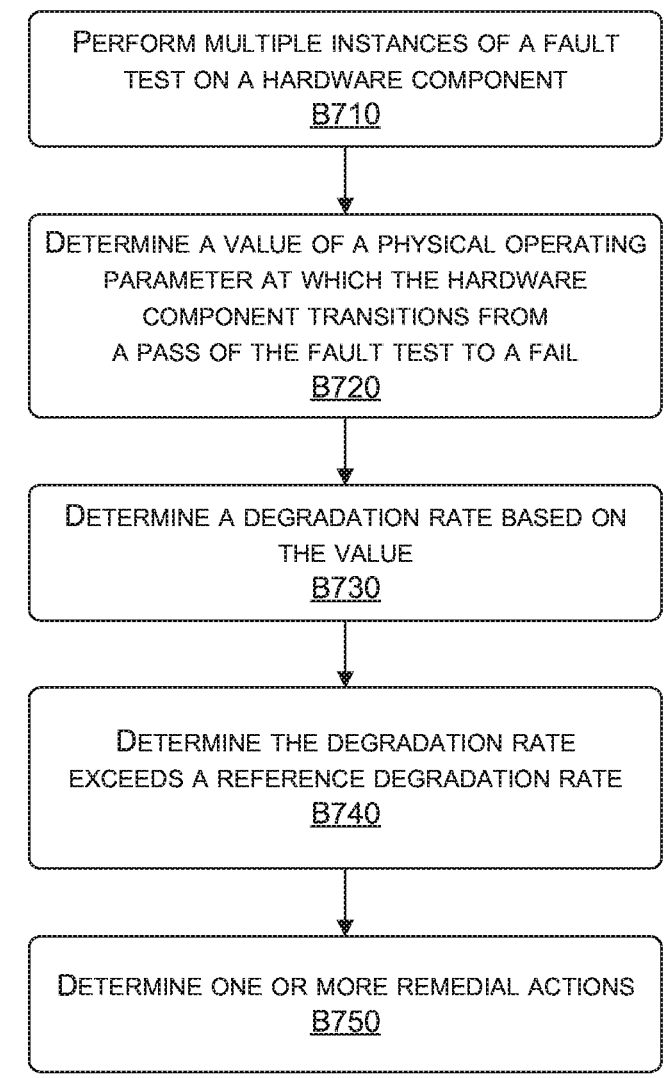
FIG. 7 is a flow diagram illustrating a method for predicting permanent faults in hardware components based on multiple iterations of a fault test, in accordance with some embodiments of the present disclosure.

Referring now to FIG. 7, FIG. 7 is a flow diagram showing a method 700 for predicting permanent faults in hardware components based on multiple iterations of a fault test, in accordance with some embodiments of the present disclosure. The method 700 at block B710, includes performing multiple instances of a fault test on a hardware component. For example, the test controller 122 may use the fault tester 106 to perform multiple instances of a fault test on the hardware components 102A of the computing platform 100 by applying different values of a physical operating parameter to the hardware component 102A for each of the instances. This may occur in the test run 320, as an example.

The method 700, at block B720, includes determining a value of a physical operating parameter at which the hardware component transitions from a pass of the fault test to a fail. For example, the performance characteristic determiner 108 may determine, from the results 208 of the multiple instances of the fault test, a value of the physical operating parameter at which the hardware component 102A transitions from a passing of the fault test to a failing of the fault test. An example may include a value corresponding to the test stage 306 and the test stage 308 of the test run 320.

The method 700, at block B730 includes determining a degradation rate based on the value. For example, the degradation rate determiner 114 may determine the degradation rate 212 corresponds to a cutoff value of the physical operating parameter at which the hardware component 102A is capable of passing the fault test based at least in part on the value of the physical operating parameter. In examples, the degradation rate may be based on the value corresponding to the test stage 306 and the test stage 308 of the test run 320, and a value corresponding to a cutoff value of the performance characteristic from a prior test run.

The method 700, at block B740 includes determining the degradation rate exceeds a reference degradation rate. For example, the degradation rate analyzer 116 may determine the degradation rate 212 exceeds a reference degradation rate.

The method 700, at block B750 includes determining one or more remedial actions. For example, the remedial action manager 118 may determine one or more remedial actions based at least in part on the degradation rate 212 exceeding the reference degradation rate (e.g., using the analysis results 214 and/or the predication data 614).

Figure 8:
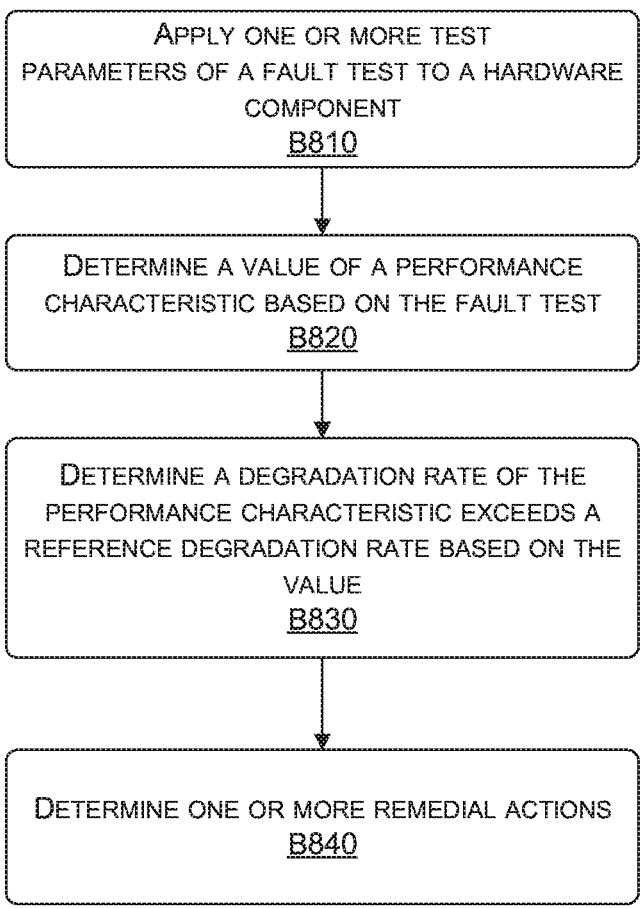
FIG. 8 is flow diagram illustrating a method for predicting permanent faults in hardware components using values of a performance characteristic, in accordance with some embodiments of the present disclosure.

Referring now to FIG. 8, FIG. 8 is a flow diagram illustrating a method 800 for predicting permanent faults in hardware components using values of a performance characteristic, in accordance with some embodiments of the present disclosure.

The method 800, at block B810 includes applying one or more test parameters of a fault test to a hardware component. For example, the fault tester 106 may apply one or more test parameters of a fault test to the hardware component 102A of the computing platform 100 to produce one or more outputs of the hardware component 102A.

The method 800, at block B820 includes determining a value of a performance characteristic based on the fault test. For example, the performance characteristic determiner 108 may determine a value of a performance characteristic of the hardware component 102A based at least in part on analyzing the one or more outputs of the hardware component 102A.

The method 800, at block B830, includes determining a degradation rate of the performance characteristic exceeds a reference degradation rate based on the value. For example, the degradation rate analyzer 116 may determine a degradation rate of the performance characteristic of the hardware component 102A exceeds a reference degradation rate based at least in part on a measurement that indicates an operational duration the hardware component 102A has operated.

The method 800, at block B840, includes determining one or more remedial actions. For example, the remedial action manager 849 may determine one or more remedial actions based at least in part on the degradation rate of the performance characteristic exceeding the reference degradation rate.

Referring now to FIGS. 9A-9D, FIG. 9A is an illustration of an example autonomous vehicle 900, in accordance with some embodiments of the present disclosure. The autonomous vehicle 900 (alternatively referred to herein as the "vehicle 900") may include a passenger vehicle, such as a car, a truck, a bus, and/or another type of vehicle that accommodates one or more passengers. Autonomous vehicles are generally described in terms of automation levels, defined by the National Highway Traffic Safety Administration (NHTSA), a division of the US Department of Transportation, and the Society of Automotive Engineers (SAE) "Taxonomy and Definitions for Terms Related to Driving Automation Systems for On-Road Motor Vehicles" (Standard No. J3016-201806, published on Jun. 15, 2018, Standard No. J3016-201609, published on Sep. 30, 2016, and previous and future versions of this standard). The vehicle 900 may be capable of functionality in accordance with one or more of Level 3-Level 5 of the autonomous driving levels. For example, the vehicle 900 may be capable of conditional automation (Level 3), high automation (Level 4), and/or full automation (Level 5), depending on the embodiment.

The vehicle 900 may include components such as a chassis, a vehicle body, wheels (e.g., 2, 4, 6, 8, 18, etc.), tires, axles, and other components of a vehicle. Various components of the vehicle 900 are described herein, which may be some example hardware component(s) (e.g., hardware component(s) 102 described in FIG. 1). In some embodiments, the fault tester 100 and other components of the computing platform 100 may be implemented continuously, while the vehicle 900 is in operation and/or when the vehicle is not in active operation.

The vehicle 900 may include a propulsion system 950, such as an internal combustion engine, hybrid electric power plant, an all-electric engine, and/or another propulsion system type. The propulsion system 950 may be connected to a drive train of the vehicle 900, which may include a transmission, to enable the propulsion of the vehicle 900. The propulsion system 950 may be controlled in response to receiving signals from the throttle/accelerator 952.

A steering system 954, which may include a steering wheel, may be used to steer the vehicle 900 (e.g., along a desired path or route) when the propulsion system 950 is operating (e.g., when the vehicle is in motion). The steering system 954 may receive signals from a steering actuator 956. The steering wheel may be optional for full automation (Level 5) functionality.

In at least one embodiment, a hardware component 102 of FIG. 1 may be included in the steering actuator 956 and the remedial actuation manager 118 may initiate one or more actions with respect to the steering actuator 956 (e.g., check engine light, dashboard warning, error code logging, etc.).

The brake sensor system 946 may be used to operate the vehicle brakes in response to receiving signals from the brake actuators 948 and/or brake sensors.

In at least one embodiment, a hardware component 102 of FIG. 1 may be included in the brake actuators 948 and/or the brake sensors and the remedial actuation manager 118 may initiate one or more actions with respect to the steering actuator 956 (e.g., check engine light, dashboard warning, error code logging, etc.).

Controller(s) 936, which may include one or more system on-chips (SoCs) 904 (FIG. 9C) and/or GPU(s), may provide signals (e.g., representative of commands) to one or more components and/or systems of the vehicle 900. For example, the controller(s) may send signals to operate the vehicle brakes via one or more brake actuators 948, to operate the steering system 954 via one or more steering actuators 956, to operate the propulsion system 950 via one or more throttle/accelerators 952. In at least one embodiment, the signals may be used to effectuate and/or cause the one or more remedial actions by the remedial action manager 118. The controller(s) 936 may include one or more onboard (e.g., integrated) computing devices (e.g., supercomputers) that process sensor signals, and output operation commands (e.g., signals representing commands) to enable autonomous driving and/or to assist a human driver in driving the vehicle 900. The controller(s) 936 may include a first controller 936 for autonomous driving functions, a second controller 936 for functional safety functions, a third controller 936 for artificial intelligence functionality (e.g., computer vision), a fourth controller 936 for infotainment functionality, a fifth controller 936 for redundancy in emergency conditions, and/or other controllers. In some examples, a single controller 936 may handle two or more of the above functionalities, two or more controllers 936 may handle a single functionality, and/or any combination thereof.

The controller(s) 936 may provide the signals for controlling one or more components and/or systems of the vehicle 900 in response to sensor data received from one or more sensors (e.g., sensor inputs). The sensor data may be received from, for example and without limitation, global navigation satellite systems sensor(s) 958 (e.g., Global Positioning System sensor(s)), RADAR sensor(s) 960, ultrasonic sensor(s) 962, LIDAR sensor(s) 964, inertial measurement unit (IMU) sensor(s) 966 (e.g., accelerometer(s), gyroscope(s), magnetic compass(es), magnetometer(s), etc.), microphone(s) 996, stereo camera(s) 968, wide-view camera(s) 970 (e.g., fisheye cameras), infrared camera(s)

972, surround camera(s) 974 (e.g., 360 degree cameras), long-range and/or mid-range camera(s) 998, speed sensor(s) 944 (e.g., for measuring the speed of the vehicle 900), vibration sensor(s) 942, steering sensor(s) 940, brake sensor(s) (e.g., as part of the brake sensor system 946), and/or other sensor types.

One or more of the controller(s) 936 may receive inputs (e.g., represented by input data) from an instrument cluster 932 of the vehicle 900 and provide outputs (e.g., represented by output data, display data, etc.) via a human-machine interface (HMI) display 934, an audible annunciator, a loudspeaker, and/or via other components of the vehicle 900. The outputs may include information such as vehicle velocity, speed, time, map data (e.g., the HD map 922 of FIG. 9C), location data (e.g., the vehicle's 900 location, such as on a map), direction, location of other vehicles (e.g., an occupancy grid), information about objects and status of objects as perceived by the controller(s) 936, etc. For example, the HMI display 934 may display information about the presence of one or more objects (e.g., a street sign, caution sign, traffic light changing, etc.), and/or information about driving maneuvers the vehicle has made, is making, or will make (e.g., changing lanes now, taking exit 34B in two miles, etc.).

The vehicle 900 further includes a network interface 924, which may use one or more wireless antenna(s) 926 and/or modem(s) to communicate over one or more networks. For example, the network interface 924 may be capable of communication over LTE, WCDMA, UMTS, GSM, CDMA2000, etc. The wireless antenna(s) 926 may also enable communication between objects in the environment (e.g., vehicles, mobile devices, etc.), using local area network(s), such as Bluetooth, Bluetooth LE, Z-Wave, ZigBee, etc., and/or low power wide-area network(s) (LPWANs), such as LoRaWAN, SigFox, etc.

In at least one embodiment, the one or more remedial actions of the remedial action manager 118 may include transmitting any of the various indicators or messages described herein over the network interface 924.

Figure 9A:
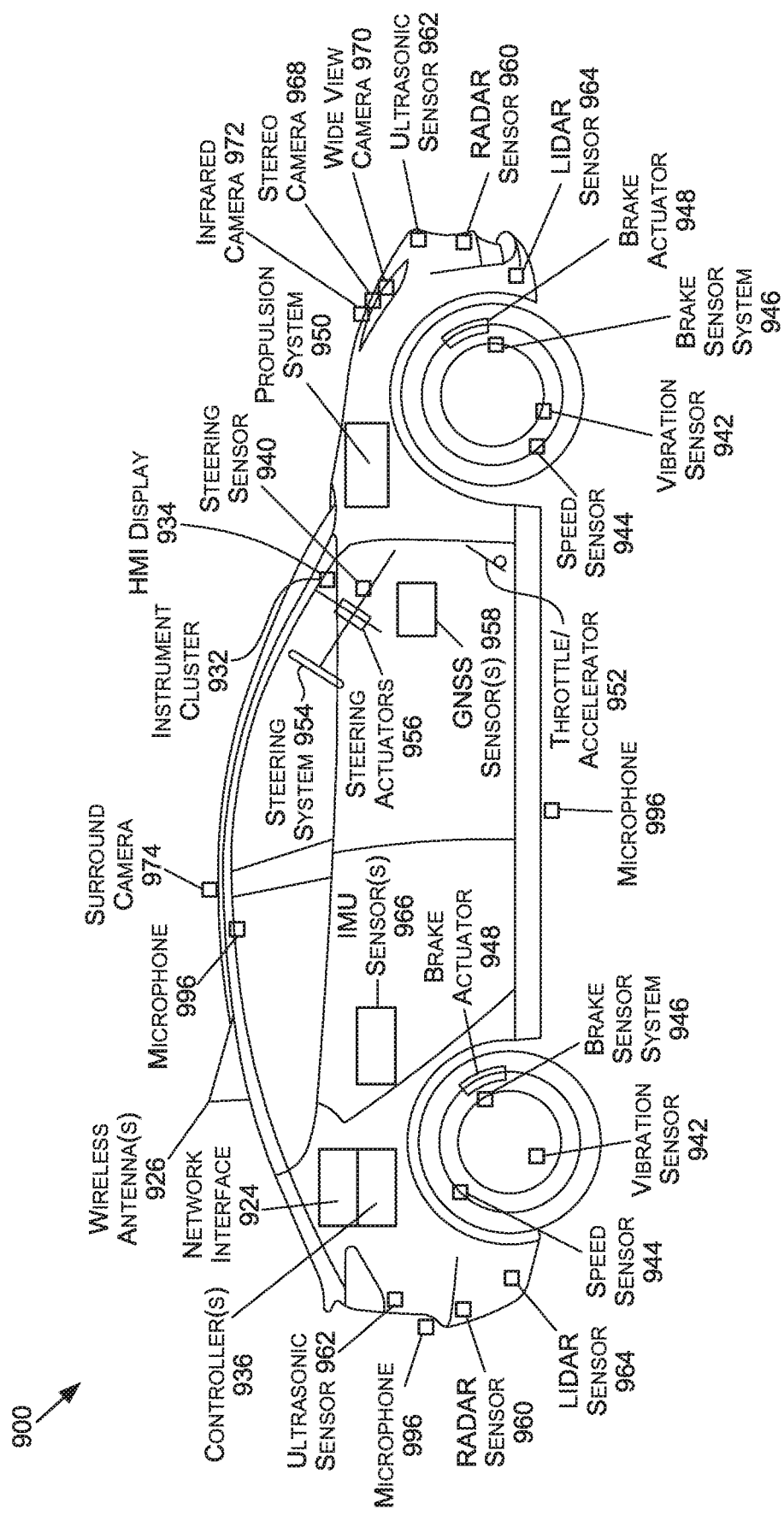
FIG. 9A is an illustration of an example autonomous vehicle, in accordance with some embodiments of the present disclosure.
Figure 9B:
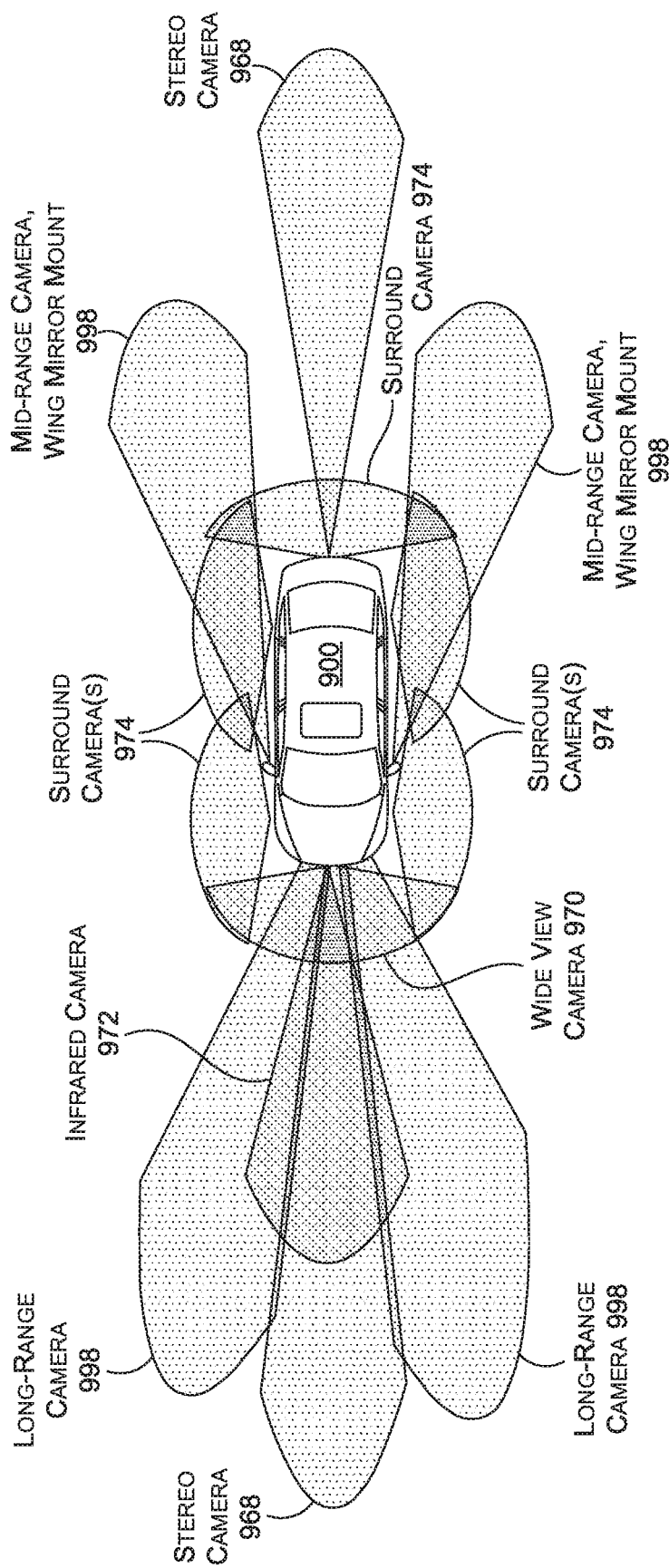
FIG. 9B is an example of camera locations and fields of view for the example autonomous vehicle of FIG. 9A, in accordance with some embodiments of the present disclosure.

FIG. 9B is an example of camera locations and fields of view for the example autonomous vehicle 900 of FIG. 9A, in accordance with some embodiments of the present disclosure. The cameras and respective fields of view are one example embodiment and are not intended to be limiting. For example, additional and/or alternative cameras may be included and/or the cameras may be located at different locations on the vehicle 900.

The camera types for the cameras may include, but are not limited to, digital cameras that may be adapted for use with the components and/or systems of the vehicle 900. The camera(s) may operate at automotive safety integrity level (ASIL) B and/or at another ASIL. The camera types may be capable of any image capture rate, such as 60 frames per second (fps), 820 fps, 240 fps, etc., depending on the embodiment. The cameras may be capable of using rolling shutters, global shutters, another type of shutter, or a combination thereof. In some examples, the color filter array may include a red clear (RCCC) color filter array, a red clear blue (RCCB) color filter array, a red blue green clear (RBGC) color filter array, a Foveon X3 color filter array, a Bayer sensors (RGGB) color filter array, a monochrome sensor color filter array, and/or another type of color filter array. In some embodiments, clear pixel cameras, such as cameras with an RCCC, an RCCB, and/or an RBGC color filter array, may be used in an effort to increase light sensitivity.

In some examples, one or more of the camera(s) may be used to perform advanced driver assistance systems (ADAS) functions (e.g., as part of a redundant or fail-safe design). For example, a Multi-Function Mono Camera may be installed to provide functions including lane departure warning, traffic sign assist and intelligent headlamp control. One or more of the camera(s) (e.g., all of the cameras) may record and provide image data (e.g., video) simultaneously.

One or more of the cameras may be mounted in a mounting assembly, such as a custom designed (3-D printed) assembly, in order to cut out stray light and reflections from within the car (e.g., reflections from the dashboard reflected in the windshield mirrors) which may interfere with the camera's image data capture abilities. With reference to wing-mirror mounting assemblies, the wing-mirror assemblies may be custom 3-D printed so that the camera mounting plate matches the shape of the wing-mirror. In some examples, the camera(s) may be integrated into the wing-mirror. For side-view cameras, the camera(s) may also be integrated within the four pillars at each corner of the cabin.

Cameras with a field of view that include portions of the environment in front of the vehicle 900 (e.g., front-facing cameras) may be used for surround view, to help identify forward facing paths and obstacles, as well aid in, with the help of one or more controllers 936 and/or control SoCs, providing information critical to generating an occupancy grid and/or determining the preferred vehicle paths. Front-facing cameras may be used to perform many of the same ADAS functions as LIDAR, including emergency braking, pedestrian detection, and collision avoidance. Front-facing cameras may also be used for ADAS functions and systems including Lane Departure Warnings ("LDW"), Autonomous Cruise Control ("ACC"), and/or other functions such as traffic sign recognition.

A variety of cameras may be used in a front-facing configuration, including, for example, a monocular camera platform that includes a CMOS (complementary metal oxide semiconductor) color imager. Another example may be a wide-view camera(s) 970 that may be used to perceive objects coming into view from the periphery (e.g., pedestrians, crossing traffic or bicycles). Although only one wide-view camera is illustrated in FIG. 9B, there may any number of wide-view cameras 970 on the vehicle 900. In addition, long-range camera(s) 998 (e.g., a long-view stereo camera pair) may be used for depth-based object detection, especially for objects for which a neural network has not yet been trained. The long-range camera(s) 998 may also be used for object detection and classification, as well as basic object tracking.

One or more stereo cameras 968 may also be included in a front-facing configuration. The stereo camera(s) 968 may include an integrated control unit comprising a scalable processing unit, which may provide a programmable logic (FPGA) and a multi-core micro-processor with an integrated CAN or Ethernet interface on a single chip. Such a unit may be used to generate a 3-D map of the vehicle's environment, including a distance estimate for all the points in the image. An alternative stereo camera(s) 968 may include a compact stereo vision sensor(s) that may include two camera lenses (one each on the left and right) and an image processing chip that may measure the distance from the vehicle to the target object and use the generated information (e.g., metadata) to activate the autonomous emergency braking and lane departure warning functions. Other types of stereo camera(s) 968 may be used in addition to, or alternatively from, those described herein.

Cameras with a field of view that include portions of the environment to the side of the vehicle 900 (e.g., side-view cameras) may be used for surround view, providing information used to create and update the occupancy grid, as well as to generate side impact collision warnings. For example, surround camera(s) 974 (e.g., four surround cameras 974 as illustrated in FIG. 9B) may be positioned to on the vehicle 900. The surround camera(s) 974 may include wide-view camera(s) 970, fisheye camera(s), 360 degree camera(s), and/or the like. Four example, four fisheye cameras may be positioned on the vehicle's front, rear, and sides. In an alternative arrangement, the vehicle may use three surround camera(s) 974 (e.g., left, right, and rear), and may leverage one or more other camera(s) (e.g., a forward facing camera) as a fourth surround view camera.

Cameras with a field of view that include portions of the environment to the rear of the vehicle 900 (e.g., rear-view cameras) may be used for park assistance, surround view, rear collision warnings, and creating and updating the occupancy grid. A wide variety of cameras may be used including, but not limited to, cameras that are also suitable as a front-facing camera(s) (e.g., long-range and/or mid-range camera(s) 998, stereo camera(s) 968), infrared camera(s) 972, etc.), as described herein.

Figure 9C:
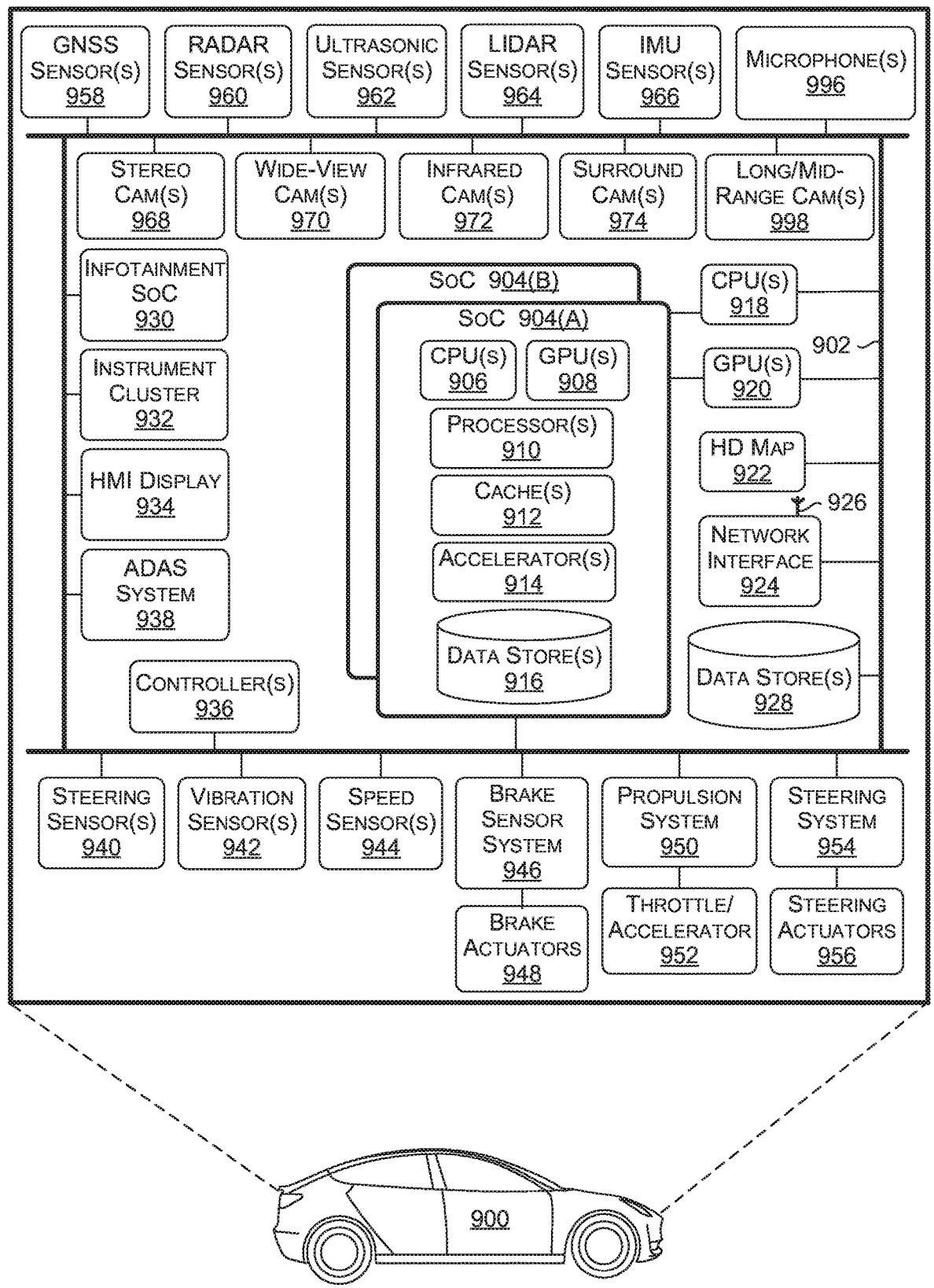
FIG. 9C is a block diagram of an example system architecture for the example autonomous vehicle of FIG. 9A, in accordance with some embodiments of the present disclosure.

FIG. 9C is a block diagram of an example system architecture for the example autonomous vehicle 900 of FIG. 9A, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

Each of the components, features, and systems of the vehicle 900 in FIG. 9C are illustrated as being connected via bus 902. The bus 902 may include a Controller Area Network (CAN) data interface (alternatively referred to herein as a "CAN bus"). A CAN may be a network inside the vehicle 900 used to aid in control of various features and functionality of the vehicle 900, such as actuation of brakes, acceleration, braking, steering, windshield wipers, etc. A CAN bus may be configured to have dozens or even hundreds of nodes, each with its own unique identifier (e.g., a CAN ID). The CAN bus may be read to find steering wheel angle, ground speed, engine revolutions per minute (RPMs), button positions, and/or other vehicle status indicators. The CAN bus may be ASIL B compliant.

Although the bus 902 is described herein as being a CAN bus, this is not intended to be limiting. For example, in addition to, or alternatively from, the CAN bus, FlexRay and/or Ethernet may be used. Additionally, although a single line is used to represent the bus 902, this is not intended to be limiting. For example, there may be any number of busses 902, which may include one or more CAN busses, one or more FlexRay busses, one or more Ethernet busses, and/or one or more other types of busses using a different protocol. In some examples, two or more busses 902 may be used to perform different functions, and/or may be used for redundancy. For example, a first bus 902 may be used for collision avoidance functionality and a second bus 902 may be used for actuation control. In any example, each bus 902 may communicate with any of the components of the vehicle 900, and two or more busses 902 may communicate with the same components. In some examples, each SoC 904, each controller 936, and/or each computer within the vehicle may have access to the same input data (e.g., inputs from sensors of the vehicle 900), and may be connected to a common bus, such the CAN bus.

The vehicle 900 may include one or more controller(s) 936, such as those described herein with respect to FIG. 9A. The controller(s) 936 may be used for a variety of functions. The controller(s) 936 may be coupled to any of the various other components and systems of the vehicle 900, and may be used for control of the vehicle 900, artificial intelligence of the vehicle 900, infotainment for the vehicle 900, and/or the like.

The vehicle 900 may include a system(s) on a chip (SoC) 904. The SoC 904 may include CPU(s) 906, GPU(s) 908, processor(s) 910, cache(s) 912, accelerator(s) 914, data store(s) 916, and/or other components and features not illustrated. The SoC(s) 904 may be used to control the vehicle 900 in a variety of platforms and systems. For example, the SoC(s) 904 may be combined in a system (e.g., the system of the vehicle 900) with an HD map 922 which may obtain map refreshes and/or updates via a network interface 924 from one or more servers (e.g., server(s) 978 of FIG. 9D).

In at least one embodiment, one or more of the SoC(s) 904 may include one or more hardware components 102 (e.g., the CPU(s) 906, the GPU(s) 906, the processor(s) 910, the cache(s) 912, the accelerator(s) 914, and/or the data store(s) 916) and/or one or more degradation detection systems 104.

The CPU(s) 906 may include a CPU cluster or CPU complex (alternatively referred to herein as a "CCPLEX"). The CPU(s) 906 may include multiple cores and/or L2 caches. For example, in some embodiments, the CPU(s) 906 may include eight cores in a coherent multi-processor configuration. In some embodiments, the CPU(s) 906 may include four dual-core clusters where each cluster has a dedicated L2 cache (e.g., a 2 MB L2 cache). The CPU(s) 906 (e.g., the CCPLEX) may be configured to support simultaneous cluster operation enabling any combination of the clusters of the CPU(s) 906 to be active at any given time.

The CPU(s) 906 may implement power management capabilities that include one or more of the following features: individual hardware blocks may be clock-gated automatically when idle to save dynamic power; each core clock may be gated when the core is not actively executing instructions due to execution of WFI/WFE instructions; each core may be independently power-gated; each core cluster may be independently clock-gated when all cores are clock-gated or power-gated; and/or each core cluster may be independently power-gated when all cores are power-gated. The CPU(s) 906 may further implement an enhanced algorithm for managing power states, where allowed power states and expected wakeup times are specified, and the hardware/microcode determines the best power state to enter for the core, cluster, and CCPLEX. The processing cores may support simplified power state entry sequences in software with the work offloaded to microcode.

The GPU(s) 908 may include an integrated GPU (alternatively referred to herein as an "iGPU"). The GPU(s) 908 may be programmable and may be efficient for parallel workloads. The GPU(s) 908, in some examples, may use an enhanced tensor instruction set. The GPU(s) 908 may include one or more streaming microprocessors, where each streaming microprocessor may include an L1 cache (e.g., an L1 cache with at least 96 KB storage capacity), and two or more of the streaming microprocessors may share an L2 cache (e.g., an L2 cache with a 512 KB storage capacity). In some embodiments, the GPU(s) 908 may include at least eight streaming microprocessors. The GPU(s) 908 may use compute application programming interface(s) (API(s)). In addition, the GPU(s) 908 may use one or more parallel computing platforms and/or programming models (e.g., NVIDIA's CUDA).

The GPU(s) 908 may be power-optimized for best performance in automotive and embedded use cases. For example, the GPU(s) 908 may be fabricated on a Fin field-effect transistor (FinFET). However, this is not intended to be limiting and the GPU(s) 908 may be fabricated using other semiconductor manufacturing processes. Each streaming microprocessor may incorporate a number of mixed-precision processing cores partitioned into multiple blocks. For example, and without limitation, 64 PF32 cores and 32 PF64 cores may be partitioned into four processing blocks. In such an example, each processing block may be allocated 16 FP32 cores, 8 FP64 cores, 16 INT32 cores, two mixed-precision NVIDIA TENSOR COREs for deep learning matrix arithmetic, an L0 instruction cache, a warp scheduler, a dispatch unit, and/or a 64 KB register file. In addition, the streaming microprocessors may include independent parallel integer and floating point data paths to provide for efficient execution of workloads with a mix of computation and addressing calculations. The streaming microprocessors may include independent thread scheduling capability to enable finer-grain synchronization and cooperation between parallel threads. The streaming microprocessors may include a combined L1 data cache and shared memory unit in order to improve performance while simplifying programming.

The GPU(s) 908 may include a high bandwidth memory (HBM) and/or a 16 GB HBM2 memory subsystem to provide, in some examples, about 900 GB/second peak memory bandwidth. In some examples, in addition to, or alternatively from, the HBM memory, a synchronous graphics random-access memory (SGRAM) may be used, such as a graphics double data rate type five synchronous random-access memory (GDDR5).

The GPU(s) 908 may include unified memory technology including access counters to allow for more accurate migration of memory pages to the processor that accesses them most frequently, thereby improving efficiency for memory ranges shared between processors. In some examples, address translation services (ATS) support may be used to allow the GPU(s) 908 to access the CPU(s) 906 page tables directly. In such examples, when the GPU(s) 908 memory management unit (MMU) experiences a miss, an address translation request may be transmitted to the CPU(s) 906. In response, the CPU(s) 906 may look in its page tables for the virtual-to-physical mapping for the address and transmits the translation back to the GPU(s) 908. As such, unified memory technology may allow a single unified virtual address space for memory of both the CPU(s) 906 and the GPU(s) 908, thereby simplifying the GPU(s) 808 programming and porting of applications to the GPU(s) 908.

In addition, the GPU(s) 908 may include an access counter that may keep track of the frequency of access of the GPU(s) 908 to memory of other processors. The access counter may help ensure that memory pages are moved to the physical memory of the processor that is accessing the pages most frequently.

The SoC(s) 904 may include any number of cache(s) 912, including those described herein. For example, the cache(s) 912 may include an L3 cache that is available to both the CPU(s) 906 and the GPU(s) 908 (e.g., that is connected both the CPU(s) 906 and the GPU(s) 908). The cache(s) 912 may include a write-back cache that may keep track of states of lines, such as by using a cache coherence protocol (e.g., MEI, MESI, MSI, etc.). The L3 cache may include 4 MB or more, depending on the embodiment, although smaller cache sizes may be used.

The SoC(s) 904 may include one or more accelerators 914 (e.g., hardware accelerators, software accelerators, or a combination thereof). For example, the SoC(s) 904 may include a hardware acceleration cluster that may include optimized hardware accelerators and/or large on-chip memory. The large on-chip memory (e.g., 4 MB of SRAM), may enable the hardware acceleration cluster to accelerate neural networks and other calculations. The hardware acceleration cluster may be used to complement the GPU(s) 908 and to off-load some of the tasks of the GPU(s) 908 (e.g., to free up more cycles of the GPU(s) 908 for performing other tasks). As an example, the accelerator(s) 914 may be used for targeted workloads (e.g., perception, convolutional neural networks (CNNs), etc.) that are stable enough to be amenable to acceleration. The term "CNN," as used herein, may include all types of CNNs, including region-based or regional convolutional neural networks (RCNNs) and Fast RCNNs (e.g., as used for object detection).

The accelerator(s) 914 (e.g., the hardware acceleration cluster) may include a deep learning accelerator(s) (DLA). The DLA(s) may include one or more Tensor processing units (TPUs) that may be configured to provide an additional ten trillion operations per second for deep learning applications and inferencing. The TPUs may be accelerators configured to, and optimized for, performing image processing functions (e.g., for CNNs, RCNNs, etc.). The DLA(s) may further be optimized for a specific set of neural network types and floating point operations, as well as inferencing. The design of the DLA(s) may provide more performance per millimeter than a general-purpose GPU, and vastly exceeds the performance of a CPU. The TPU(s) may perform several functions, including a single-instance convolution function, supporting, for example, INT8, INT16, and FP16 data types for both features and weights, as well as post-processor functions.

The DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones; a CNN for facial recognition and vehicle owner identification using data from camera sensors; and/or a CNN for security and/or safety related events.

The DLA(s) may perform any function of the GPU(s) 908, and by using an inference accelerator, for example, a designer may target either the DLA(s) or the GPU(s) 908 for any function. For example, the designer may focus processing of CNNs and floating point operations on the DLA(s) and leave other functions to the GPU(s) 908 and/or other accelerator(s) 914.

The accelerator(s) 914 (e.g., the hardware acceleration cluster) may include a programmable vision accelerator(s) (PVA), which may alternatively be referred to herein as a computer vision accelerator. The PVA(s) may be designed and configured to accelerate computer vision algorithms for the advanced driver assistance systems (ADAS), autonomous driving, and/or augmented reality (AR) and/or virtual reality (VR) applications. The PVA(s) may provide a balance between performance and flexibility. For example, each PVA(s) may include, for example and without limitation, any number of reduced instruction set computer (RISC) cores, direct memory access (DMA), and/or any number of vector processors.

The RISC cores may interact with image sensors (e.g., the image sensors of any of the cameras described herein), image signal processor(s), and/or the like. Each of the RISC cores may include any amount of memory. The RISC cores may use any of a number of protocols, depending on the embodiment. In some examples, the RISC cores may execute a real-time operating system (RTOS). The RISC cores may be implemented using one or more integrated circuit devices, application specific integrated circuits (ASICs), and/or memory devices. For example, the RISC cores may include an instruction cache and/or a tightly coupled RAM.

The DMA may enable components of the PVA(s) to access the system memory independently of the CPU(s) 906. The DMA may support any number of features used to provide optimization to the PVA including, but not limited to, supporting multi-dimensional addressing and/or circular addressing. In some examples, the DMA may support up to six or more dimensions of addressing, which may include block width, block height, block depth, horizontal block stepping, vertical block stepping, and/or depth stepping.

The vector processors may be programmable processors that may be designed to efficiently and flexibly execute programming for computer vision algorithms and provide signal processing capabilities. In some examples, the PVA may include a PVA core and two vector processing subsystem partitions. The PVA core may include a processor subsystem, DMA engine(s) (e.g., two DMA engines), and/or other peripherals. The vector processing subsystem may operate as the primary processing engine of the PVA, and may include a vector processing unit (VPU), an instruction cache, and/or vector memory (e.g., VMEM). A VPU core may include a digital signal processor such as, for example, a single instruction, multiple data (SIMD), very long instruction word (VLIW) digital signal processor. The combination of the SIMD and VLIW may enhance throughput and speed.

Each of the vector processors may include an instruction cache and may be coupled to dedicated memory. As a result, in some examples, each of the vector processors may be configured to execute independently of the other vector processors. In other examples, the vector processors that are included in a particular PVA may be configured to employ data parallelism. For example, in some embodiments, the plurality of vector processors included in a single PVA may execute the same computer vision algorithm, but on different regions of an image. In other examples, the vector processors included in a particular PVA may simultaneously execute different computer vision algorithms, on the same image, or even execute different algorithms on sequential images or portions of an image. Among other things, any number of PVAs may be included in the hardware acceleration cluster and any number of vector processors may be included in each of the PVAs. In addition, the PVA(s) may include additional error correcting code (ECC) memory, to enhance overall system safety.

The accelerator(s) 914 (e.g., the hardware acceleration cluster) may include a computer vision network on-chip and SRAM, for providing a high-bandwidth, low latency SRAM for the accelerator(s) 914. In some examples, the on-chip memory may include at least 4 MB SRAM, consisting of, for example and without limitation, eight field-configurable memory blocks, that may be accessible by both the PVA and the DLA. Each pair of memory blocks may include an advanced peripheral bus (APB) interface, configuration circuitry, a controller, and a multiplexer. Any type of memory may be used. The PVA and DLA may access the memory via a backbone that provides the PVA and DLA with high-speed access to memory. The backbone may include a computer vision network on-chip that interconnects the PVA and the DLA to the memory (e.g., using the APB).

The computer vision network on-chip may include an interface that determines, before transmission of any control signal/address/data, that both the PVA and the DLA provide ready and valid signals. Such an interface may provide for separate phases and separate channels for transmitting control signals/addresses/data, as well as burst-type communications for continuous data transfer. This type of interface may comply with ISO 26262 or IEC 61508 standards, although other standards and protocols may be used.

In some examples, the SoC(s) 904 may include a real-time ray-tracing hardware accelerator, such as described in U.S. patent application Ser. No. 16/101,232, filed on Aug. 10, 2018. The real-time ray-tracing hardware accelerator may be used to quickly and efficiently determine the positions and extents of objects (e.g., within a world model), to generate real time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses.

The accelerator(s) 914 (e.g., the hardware accelerator cluster) have a wide array of uses for autonomous driving. The PVA may be a programmable vision accelerator that may be used for key processing stages in ADAS and autonomous vehicles. The PVA's capabilities are a good match for algorithmic domains needing predictable processing, at low power and low latency. In other words, the PVA performs well on semi-dense or dense regular computation, even on small data sets, which need predictable run-times with low latency and low power. Thus, in the context of platforms for autonomous vehicles, the PVAs are designed to run classic computer vision algorithms, as they are efficient at object detection and operating on integer math.

For example, according to one embodiment of the technology, the PVA is used to perform computer stereo vision. A semi-global matching-based algorithm may be used in some examples, although this is not intended to be limiting. Many applications for Level 3-5 autonomous driving require motion estimation/stereo matching on-the-fly (e.g., structure from motion, pedestrian recognition, lane detection, etc.). The PVA may perform computer stereo vision function on inputs from two monocular cameras.

In some examples, the PVA may be used to perform dense optical flow. According to process raw RADAR data (e.g., using a 4D Fast Fourier Transform) to provide Processed RADAR. In other examples, the PVA is used for time of flight depth processing, by processing raw time of flight data to provide processed time of flight data, for example.

The DLA may be used to run any type of network to enhance control and driving safety, including for example, a neural network that outputs a measure of confidence for each object detection. Such a confidence value may be interpreted as a probability, or as providing a relative "weight" of each detection compared to other detections. This confidence value enables the system to make further decisions regarding which detections should be considered as true positive detections rather than false positive detections. For example, the system may set a threshold value for the confidence and consider only the detections exceeding the threshold value as true positive detections. In an automatic emergency braking (AEB) system, false positive detections would cause the vehicle to automatically perform emergency braking, which is obviously undesirable. Therefore, only the most confident detections should be considered as triggers for AEB. The DLA may run a neural network for regressing the confidence value. The neural network may take as its input at least some subset of parameters, such as bounding box dimensions, ground plane estimate obtained (e.g., from another subsystem), inertial measurement unit (IMU) sensor 966 output that correlates with the vehicle 900 orientation, distance, 3D location estimates of the object obtained from the neural network and/or other sensors (e.g., LIDAR sensor(s) 964 or RADAR sensor(s) 960), among others.

The SoC(s) 904 may include data store(s) 916 (e.g., memory). The data store(s) 916 may be on-chip memory of the SoC(s) 904, which may store neural networks to be executed on the GPU and/or the DLA. In some examples, the data store(s) 916 may be large enough in capacity to store multiple instances of neural networks for redundancy and safety. The data store(s) 912 may comprise L2 or L3 cache(s) 912. Reference to the data store(s) 916 may include reference to the memory associated with the PVA, DLA, and/or other accelerator(s) 914, as described herein.

The SoC(s) 904 may include one or more processor(s) 910 (e.g., embedded processors). The processor(s) 910 may include a boot and power management processor that may be a dedicated processor and subsystem to handle boot power and management functions and related security enforcement. The boot and power management processor may be a part of the SoC(s) 904 boot sequence and may provide runtime power management services. The boot power and management processor may provide clock and voltage programming, assistance in system low power state transitions, management of SoC(s) 904 thermals and temperature sensors, and/or management of the SoC(s) 904 power states. Each temperature sensor may be implemented as a ring-oscillator whose output frequency is proportional to temperature, and the SoC(s) 904 may use the ring-oscillators to detect temperatures of the CPU(s) 906, GPU(s) 908, and/or accelerator(s) 914. If temperatures are determined to exceed a threshold, the boot and power management processor may enter a temperature fault routine and put the SoC(s) 904 into a lower power state and/or put the vehicle 900 into a chauffeur to safe stop mode (e.g., bring the vehicle 900 to a safe stop).

The processor(s) 910 may further include a set of embedded processors that may serve as an audio processing engine. The audio processing engine may be an audio subsystem that enables full hardware support for multi-channel audio over multiple interfaces, and a broad and flexible range of audio I/O interfaces. In some examples, the audio processing engine is a dedicated processor core with a digital signal processor with dedicated RAM.

The processor(s) 910 may further include an always on processor engine that may provide necessary hardware features to support low power sensor management and wake use cases. The always on processor engine may include a processor core, a tightly coupled RAM, supporting peripherals (e.g., timers and interrupt controllers), various I/O controller peripherals, and routing logic.

The processor(s) 910 may further include a safety cluster engine that includes a dedicated processor subsystem to handle safety management for automotive applications. The safety cluster engine may include two or more processor cores, a tightly coupled RAM, support peripherals (e.g., timers, an interrupt controller, etc.), and/or routing logic. In a safety mode, the two or more cores may operate in a lockstep mode and function as a single core with comparison logic to detect any differences between their operations.

The processor(s) 910 may include a video image compositor that may be a processing block (e.g., implemented on a microprocessor) that implements video post-processing functions needed by a video playback application to produce the final image for the player window. The video image compositor may perform lens distortion correction on wide-view camera(s) 970, surround camera(s) 974, and/or on in-cabin monitoring camera sensors. In-cabin monitoring camera sensor is preferably monitored by a neural network running on another instance of the Advanced SoC, configured to identify in cabin events and respond accordingly.

The video image compositor may also be configured to perform stereo rectification on input stereo lens frames. The video image compositor may further be used for user interface composition when the operating system desktop is in use, and the GPU(s) 908 is not required to continuously render new surfaces. Even when the GPU(s) 908 is powered on and active doing 3D rendering, the video image compositor may be used to offload the GPU(s) 908 to improve performance and responsiveness.

The SoC(s) 904 may further include a mobile industry processor interface (MIPI) camera serial interface for receiving video and input from cameras, a high-speed interface, and/or a video input block that may be used for camera and related pixel input functions. The SoC(s) 904 may further include an input/output controller(s) that may be controlled by software and may be used for receiving I/O signals that are uncommitted to a specific role.

The SoC(s) 904 may further include a broad range of peripheral interfaces to enable communication with peripherals, audio codecs, power management, and/or other devices. The SoC(s) 904 may be used to process data from cameras (e.g., connected over Gigabit Multimedia Serial Link and Ethernet), sensors (e.g., LIDAR sensor(s) 964, RADAR sensor(s) 960, etc. that may be connected over Ethernet), data from bus 902 (e.g., speed of vehicle 900, steering wheel position, etc.), data from GNSS sensor(s) 958 (e.g., connected over Ethernet or CAN bus). The SoC(s) 904 may further include dedicated high-performance mass storage controllers that may include their own DMA engines, and that may be used to free the CPU(s) 906 from routine data management tasks.

The SoC(s) 904 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. The SoC(s) 904 may be faster, more reliable, and even more energy-efficient and space-efficient than conventional systems. For example, the accelerator(s) 914, when combined with the CPU(s) 906, the GPU(s) 908, and the data store(s) 916, may provide for a fast, efficient platform for level 3-5 autonomous vehicles.

The vehicle 900 may further include the network interface 924 which may include one or more wireless antennas 926 (e.g., one or more wireless antennas for different communication protocols, such as a cellular antenna, a Bluetooth antenna, etc.). The network interface 924 may be used to enable wireless connectivity over the Internet with the cloud (e.g., with the server(s) 978 and/or other network devices), with other vehicles, and/or with computing devices (e.g., client devices of passengers). To communicate with other vehicles, a direct link may be established between the two vehicles and/or an indirect link may be established (e.g., across networks and over the Internet). Direct links may be provided using a vehicle-to-vehicle communication link. The vehicle-to-vehicle communication link may provide the vehicle 900 information about vehicles in proximity to the vehicle 900 (e.g., vehicles in front of, on the side of, and/or behind the vehicle 900). This functionality may be part of a cooperative adaptive cruise control functionality of the vehicle 900.

The network interface 924 may include a SoC that provides modulation and demodulation functionality and enables the controller(s) 936 to communicate over wireless networks. The network interface 924 may include a radio frequency front-end for up-conversion from baseband to radio frequency, and down conversion from radio frequency to baseband. The frequency conversions may be performed through well-known processes, and/or may be performed using super-heterodyne processes. In some examples, the radio frequency front end functionality may be provided by a separate chip. The network interface may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

The vehicle 900 may further include data store(s) 928 which may include off-chip (e.g., off the SoC(s) 904) storage. The data store(s) 928 may include one or more storage elements including RAM, SRAM, DRAM, VRAM, Flash, hard disks, and/or other components and/or devices that may store at least one bit of data.

The vehicle 900 may further include GNSS sensor(s) 958. The GNSS sensor(s) 958 (e.g., GPS and/or assisted GPS sensors), to assist in mapping, perception, occupancy grid generation, and/or path planning functions. Any number of GNSS sensor(s) 958 may be used, including, for example and without limitation, a GPS using a USB connector with an Ethernet to Serial (RS-232) bridge.

The vehicle 900 may further include RADAR sensor(s) 960. The RADAR sensor(s) 960 may be used by the vehicle 900 for long-range vehicle detection, even in darkness and/or severe weather conditions. RADAR functional safety levels may be ASIL B. The RADAR sensor(s) 960 may use the CAN and/or the bus 902 (e.g., to transmit data generated by the RADAR sensor(s) 960) for control and to access object tracking data, with access to Ethernet to access raw data in some examples. A wide variety of RADAR sensor types may be used. For example, and without limitation, the RADAR sensor(s) 960 may be suitable for front, rear, and side RADAR use. In some example, Pulse Doppler RADAR sensor(s) are used.

The RADAR sensor(s) 960 may include different configurations, such as long range with narrow field of view, short range with wide field of view, short range side coverage, etc. In some examples, long-range RADAR may be used for adaptive cruise control functionality. The long-range RADAR systems may provide a broad field of view realized by two or more independent scans, such as within a 250 m range. The RADAR sensor(s) 960 may help in distinguishing between static and moving objects, and may be used by ADAS systems for emergency brake assist and forward collision warning. Long-range RADAR sensors may include monostatic multimodal RADAR with multiple (e.g., six or more) fixed RADAR antennas and a high-speed CAN and FlexRay interface. In an example with six antennas, the central four antennas may create a focused beam pattern, designed to record the vehicle's 900 surroundings at higher speeds with minimal interference from traffic in adjacent lanes. The other two antennas may expand the field of view, making it possible to quickly detect vehicles entering or leaving the vehicle's 900 lane.

Mid-range RADAR systems may include, as an example, a range of up to 860 m (front) or 80 m (rear), and a field of view of up to 42 degrees (front) or 850 degrees (rear). Short range RADAR systems may include, without limitation, RADAR sensors designed to be installed at both ends of the rear bumper. When installed at both ends of the rear bumper, such a RADAR sensor systems may create two beams that constantly monitor the blind spot in the rear and next to the vehicle.

Short range RADAR systems may be used in an ADAS system for blind spot detection and/or lane change assist.

The vehicle 900 may further include ultrasonic sensor(s) 962. The ultrasonic sensor(s) 962, which may be positioned at the front, back, and/or the sides of the vehicle 900, may be used for park assist and/or to create and update an occupancy grid. A wide variety of ultrasonic sensor(s) 962 may be used, and different ultrasonic sensor(s) 962 may be used for different ranges of detection (e.g., 2.5 m, 4 m). The ultrasonic sensor(s) 962 may operate at functional safety levels of ASIL B.

The vehicle 900 may include LIDAR sensor(s) 964. The LIDAR sensor(s) 964 may be used for object and pedestrian detection, emergency braking, collision avoidance, and/or other functions. The LIDAR sensor(s) 964 may be functional safety level ASIL B. In some examples, the vehicle 900 may include multiple LIDAR sensors 964 (e.g., two, four, six, etc.) that may use Ethernet (e.g., to provide data to a Gigabit Ethernet switch).

In some examples, the LIDAR sensor(s) 964 may be capable of providing a list of objects and their distances for a 360-degree field of view. Commercially available LIDAR sensor(s) 964 may have an advertised range of approximately 800 m, with an accuracy of 2 cm-3 cm, and with support for an 800 Mbps Ethernet connection, for example. In some examples, one or more non-protruding LIDAR sensors 964 may be used. In such examples, the LIDAR sensor(s) 964 may be implemented as a small device that may be embedded into the front, rear, sides, and/or corners of the vehicle 900. The LIDAR sensor(s) 964, in such examples, may provide up to an 820-degree horizontal and 35-degree vertical field of view, with a 200 m range even for low-reflectivity objects. Front-mounted LIDAR sensor(s) 964 may be configured for a horizontal field of view between 45 degrees and 135 degrees.

In some examples, LIDAR technologies, such as 3D flash LIDAR, may also be used. 3D Flash LIDAR uses a flash of a laser as a transmission source, to illuminate vehicle surroundings up to approximately 200 m. A flash LIDAR unit includes a receptor, which records the laser pulse transit time and the reflected light on each pixel, which in turn corresponds to the range from the vehicle to the objects.

The vehicle may further include IMU sensor(s) 966. The IMU sensor(s) 966 may be located at a center of the rear axle of the vehicle 900, in some examples. The IMU sensor(s) 966 may include, for example and without limitation, an accelerometer(s), a magnetometer(s), a gyroscope(s), a magnetic compass(es), and/or other sensor types. In some examples, such as in six-axis applications, the IMU sensor(s) 966 may include accelerometers and gyroscopes, while in nine-axis applications, the IMU sensor(s) 966 may include accelerometers, gyroscopes, and magnetometers.

In some embodiments, the IMU sensor(s) 966 may be implemented as a miniature, high performance GPS-Aided Inertial Navigation System (GPS/INS) that combines micro-electro-mechanical systems (MEMS) inertial sensors, a high-sensitivity GPS receiver, and advanced Kalman filtering algorithms to provide estimates of position, velocity, and attitude. As such, in some examples, the IMU sensor(s) 966 may enable the vehicle 900 to estimate heading without requiring input from a magnetic sensor by directly observing and correlating the changes in velocity from GPS to the IMU sensor(s) 966. In some examples, the IMU sensor(s) 966 and the GNSS sensor(s) 958 may be combined in a single integrated unit.

The vehicle may include microphone(s) 996 placed in and/or around the vehicle 900. The microphone(s) 996 may be used for emergency vehicle detection and identification, among other things.

The vehicle may further include any number of camera types, including stereo camera(s) 968, wide-view camera(s) 970, infrared camera(s) 972, surround camera(s) 974, long-range and/or mid-range camera(s) 998, and/or other camera types. The cameras may be used to capture image data around an entire periphery of the vehicle 900. The types of cameras used depends on the embodiments and requirements for the vehicle 900, and any combination of camera types may be used to provide the necessary coverage around the vehicle 900. In addition, the number of cameras may differ depending on the embodiment. For example, the vehicle may include six cameras, seven cameras, ten cameras, twelve cameras, and/or another number of cameras. The cameras may support, as an example and without limitation, Gigabit Multimedia Serial Link (GMSL) and/or Gigabit Ethernet. Each of the camera(s) is described with more detail herein with respect to FIG. 9A and FIG. 9B.

The vehicle 900 may further include vibration sensor(s) 942. The vibration sensor(s) 942 may measure vibrations of components of the vehicle, such as the axle(s). For example, changes in vibrations may indicate a change in road surfaces. In another example, when two or more vibration sensors 942 are used, the differences between the vibrations may be used to determine friction or slippage of the road surface (e.g., when the difference in vibration is between a power-driven axle and a freely rotating axle).

The vehicle 900 may include an ADAS system 938. The ADAS system 938 may include a SoC, in some examples. The ADAS system 938 may include autonomous/adaptive/automatic cruise control (ACC), cooperative adaptive cruise control (CACC), forward crash warning (FCW), automatic emergency braking (AEB), lane departure warnings (LDW), lane keep assist (LKA), blind spot warning (BSW), rear cross-traffic warning (RCTW), collision warning systems (CWS), lane centering (LC), and/or other features and functionality.

In at least one embodiment, any of the various one or more actions from the remedial action manager 118 may be with respect to the ADAS system 938 and/or one or more of the above mentioned functionalities (e.g., indicators, disabling, logging, etc.).

The ACC systems may use RADAR sensor(s) 960, LIDAR sensor(s) 964, and/or a camera(s). The ACC systems may include longitudinal ACC and/or lateral ACC. Longitudinal ACC monitors and controls the distance to the vehicle immediately ahead of the vehicle 900 and automatically adjust the vehicle speed to maintain a safe distance from vehicles ahead. Lateral ACC performs distance keeping, and advises the vehicle 900 to change lanes when necessary. Lateral ACC is related to other ADAS applications such as LCA and CWS.

CACC uses information from other vehicles that may be received via the network interface 924 and/or the wireless antenna(s) 926 from other vehicles via a wireless link, or indirectly, over a network connection (e.g., over the Internet). Direct links may be provided by a vehicle-to-vehicle (V2V) communication link, while indirect links may be infrastructure-to-vehicle (I2V) communication link. In general, the V2V communication concept provides information about the immediately preceding vehicles (e.g., vehicles immediately ahead of and in the same lane as the vehicle 900), while the I2V communication concept provides information about traffic further ahead. CACC systems may include either or both I2V and V2V information sources. Given the information of the vehicles ahead of the vehicle 900, CACC may be more reliable and it has potential to improve traffic flow smoothness and reduce congestion on the road.

FCW systems are designed to alert the driver to a hazard, so that the driver may take corrective action. FCW systems use a front-facing camera and/or RADAR sensor(s) 960, coupled to a dedicated processor, DSP, FPGA, and/or ASIC, that is electrically coupled to driver feedback, such as a display, speaker, and/or vibrating component. FCW systems may provide a warning, such as in the form of a sound, visual warning, vibration and/or a quick brake pulse.

AEB systems detect an impending forward collision with another vehicle or other object, and may automatically apply the brakes if the driver does not take corrective action within a specified time or distance parameter. AEB systems may use front-facing camera(s) and/or RADAR sensor(s) 960, coupled to a dedicated processor, DSP, FPGA, and/or ASIC. When the AEB system detects a hazard, it typically first alerts the driver to take corrective action to avoid the collision and, if the driver does not take corrective action, the AEB system may automatically apply the brakes in an effort to prevent, or at least mitigate, the impact of the predicted collision. AEB systems, may include techniques such as dynamic brake support and/or crash imminent braking.

The vehicle 900 may further include the infotainment SoC 930 (e.g., an in-vehicle infotainment system (IVI)). Although illustrated and described as a SoC, the infotainment system may not be a SoC, and may include two or more discrete components. The infotainment SoC 830 may include a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, WiFi, etc.), and/or information services (e.g., navigation systems, rear-parking assistance, a radio data system, vehicle related information such as fuel level, total distance covered, brake fuel level, oil level, door open/close, air filter information, etc.) to the vehicle 900. For example, the infotainment SoC 930 may radios, disk players, navigation systems, video players, USB and Bluetooth connectivity, carputers, in-car entertainment, WiFi, steering wheel audio controls, hands free voice control, a heads-up display (HUD), an HMI display 934, a telematics device, a control panel (e.g., for controlling and/or interacting with various components, features, and/or systems), and/or other components.

The infotainment SoC 930 may include GPU functionality. The infotainment SoC 930 may communicate over the bus 902 (e.g., CAN bus, Ethernet, etc.) with other devices, systems, and/or components of the vehicle 900. In some examples, the infotainment SoC 930 may be coupled to a supervisory MCU such that the GPU of the infotainment system may perform some self-driving functions in the event that the primary controller(s) 936 (e.g., the primary and/or backup computers of the vehicle 900) fail. In such an example, the infotainment SoC 930 may put the vehicle 900 into a chauffeur to safe stop mode, as described herein.

The vehicle 900 may further include an instrument cluster 932 (e.g., a digital dash, an electronic instrument cluster, a digital instrument panel, etc.). The instrument cluster 932 may include a controller and/or supercomputer (e.g., a discrete controller or supercomputer). The instrument cluster 932 may include a set of instrumentation such as a speedometer, fuel level, oil pressure, tachometer, odometer, turn indicators, gearshift position indicator, seat belt warning light(s), parking-brake warning light(s), engine-malfunction light(s), airbag (SRS) system information, lighting controls, safety system controls, navigation information, etc. In some examples, information may be displayed and/or shared among the infotainment SoC 930 and the instrument cluster 932. In other words, the instrument cluster 932 may be included as part of the infotainment SoC 930, or vice versa.

In at least one embodiment, one or more indicators provided by the remedial action manager 118 may be presented and/or displayed using one or more of the infotainment SoC 930, the instrument cluster 932, or the HMI display 934.

Figure 9D:
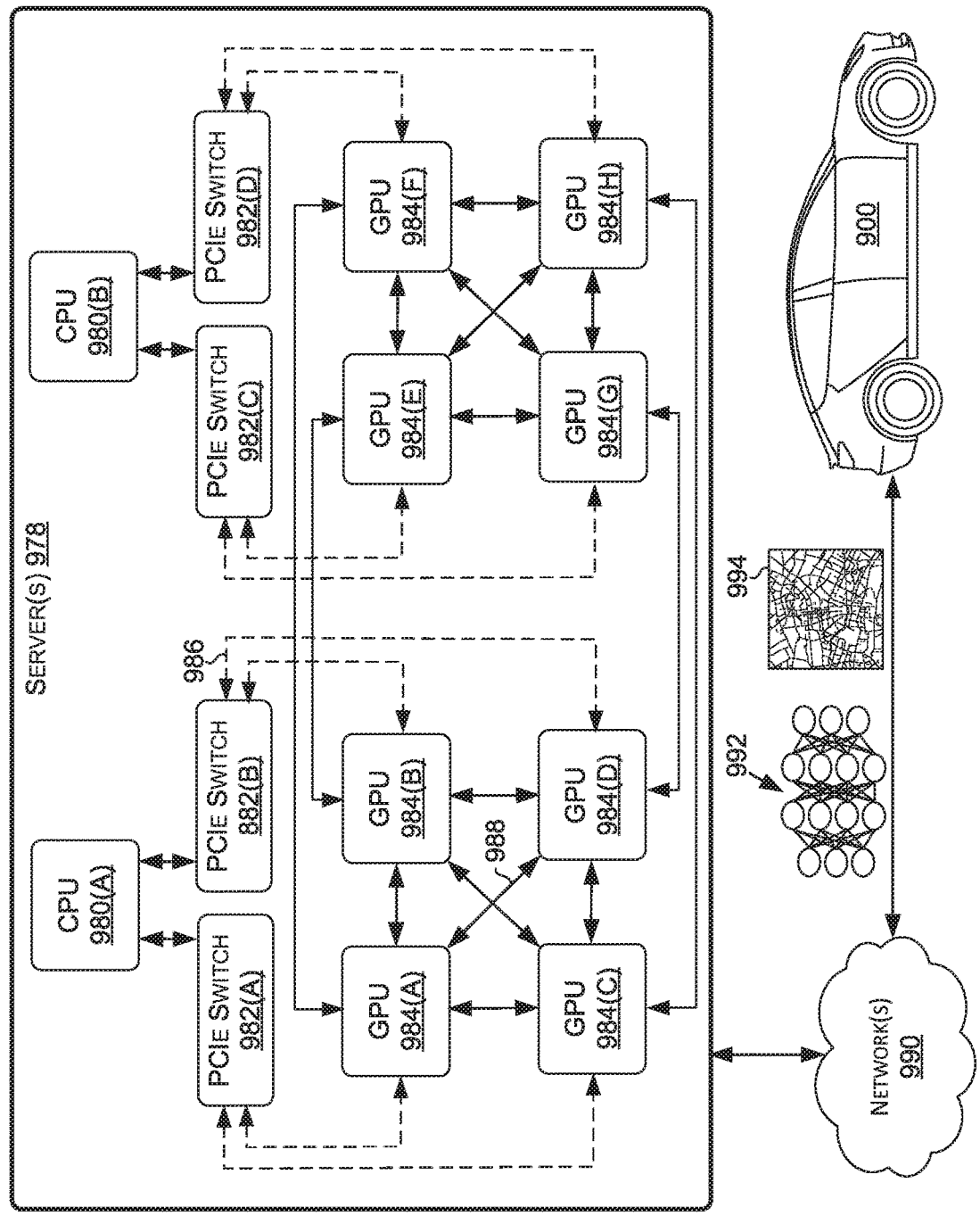
FIG. 9D is a system diagram for communication between cloud-based server(s) and the example autonomous vehicle of FIG. 9A, in accordance with some embodiments of the present disclosure.

FIG. 9D is a system diagram for communication between cloud-based server(s) and the example autonomous vehicle 900 of FIG. 9A, in accordance with some embodiments of the present disclosure. The system 976 may include server(s) 978, network(s) 990, and vehicles, including the vehicle 900. The server(s) 978 may include a plurality of GPUs 984(A)-984(H) (collectively referred to herein as GPUs 984), PCIe switches 982(A)-982(H) (collectively referred to herein as PCIe switches 982), and/or CPUs 980(A)-980(B) (collectively referred to herein as CPUs 980). The GPUs 984, the CPUs 980, and the PCIe switches may be interconnected with high-speed interconnects such as, for example and without limitation, NVLink interfaces 988 developed by NVIDIA and/or PCIe connections 986. In some examples, the GPUs 984 are connected via NVLink and/or NVSwitch SoC and the GPUs 984 and the PCIe switches 982 are connected via PCIe interconnects. Although eight GPUs 984, two CPUs 980, and two PCIe switches are illustrated, this is not intended to be limiting. Depending on the embodiment, each of the server(s) 978 may include any number of GPUs 984, CPUs 980, and/or PCIe switches. For example, the server(s) 978 may each include eight, sixteen, thirty-two, and/or more GPUs 984.

The server(s) 978 may receive, over the network(s) 990 and from the vehicles, image data representative of images showing unexpected or changed road conditions, such as recently commenced road-work. The server(s) 978 may transmit, over the network(s) 990 and to the vehicles, neural networks 992, updated neural networks 992, and/or map information 994, including information regarding traffic and road conditions. The updates to the map information 994 may include updates for the HD map 922, such as information regarding construction sites, potholes, detours, flooding, and/or other obstructions. In some examples, the neural networks 992, the updated neural networks 992, and/or the map information 994 may have resulted from new training and/or experiences represented in data received from any number of vehicles in the environment, and/or based on training performed at a datacenter (e.g., using the server(s) 978 and/or other servers).

The server(s) 978 may be used to train machine learning models (e.g., neural networks) based on training data. The training data may be generated by the vehicles, and/or may be generated in a simulation (e.g., using a game engine). In some examples, the training data is tagged (e.g., where the neural network benefits from supervised learning) and/or undergoes other pre-processing, while in other examples the training data is not tagged and/or pre-processed (e.g., where the neural network does not require supervised learning). Once the machine learning models are trained, the machine learning models may be used by the vehicles (e.g., transmitted to the vehicles over the network(s) 990, and/or the machine learning models may be used by the server(s) 978 to remotely monitor the vehicles.

In some examples, the server(s) 978 may receive data from the vehicles and apply the data to up-to-date real-time neural networks for real-time intelligent inferencing. The server(s) 978 may include deep learning supercomputers and/or dedicated AI computers powered by GPU(s) 984, such as a DGX and DGX Station machines developed by NVIDIA. However, in some examples, the server(s) 978 may include deep learning infrastructure that use only CPU-powered datacenters.

The deep learning infrastructure of the server(s) 978 may be capable of fast, real-time inferencing, and may use that capability to evaluate and verify the health of the processors, software, and/or associated hardware in the vehicle 900. For example, the deep learning infrastructure may receive periodic updates from the vehicle 900, such as a sequence of images and/or objects that the vehicle 900 has located in that sequence of images (e.g., via computer vision and/or other machine learning object classification techniques). The deep learning infrastructure may run its own neural network to identify the objects and compare them with the objects identified by the vehicle 900 and, if the results do not match and the infrastructure concludes that the AI in the vehicle 900 is malfunctioning, the server(s) 978 may transmit a signal to the vehicle 900 instructing a fail-safe computer of the vehicle 900 to assume control, notify the passengers, and complete a safe parking maneuver.

For inferencing, the server(s) 978 may include the GPU(s) 984 and one or more programmable inference accelerators (e.g., NVIDIA's TensorRT 3). The combination of GPU-powered servers and inference acceleration may make real-time responsiveness possible. In other examples, such as where performance is less critical, servers powered by CPUs, FPGAs, and other processors may be used for inferencing.

Figure 10:
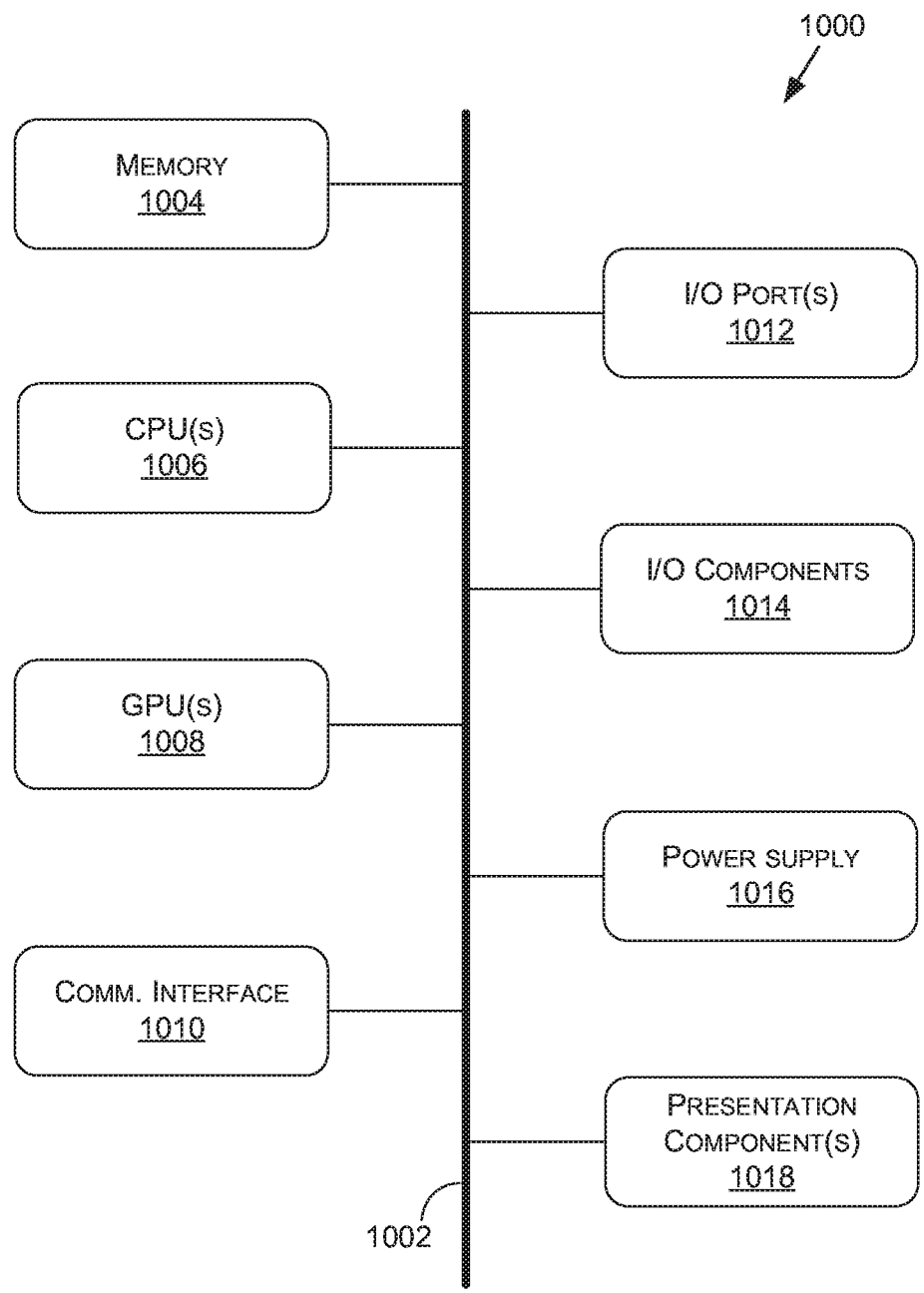
FIG. 10 is an example block diagram for an example computing device suitable for implementation of embodiments of the present disclosure.

FIG. 10 is a block diagram of an example computing device 1000 suitable for use in implementing some embodiments of the present disclosure. Computing device 1000 may include a bus 1002 that directly or indirectly couples the following devices: memory 1004, one or more central processing units (CPUs) 1006, one or more graphics processing units (GPUs) 1008, a communication interface 1010, input/output (I/O) ports 1012, input/output components 1014, a power supply 1016, and one or more presentation components 1018 (e.g., display(s)).

Although the various blocks of FIG. 10 are shown as connected via the bus 1002 with lines, this is not intended to be limiting and is for clarity only. For example, in some embodiments, a presentation component 1018, such as a display device, may be considered an I/O component 1014 (e.g., if the display is a touch screen). As another example, the CPUs 1006 and/or GPUs 1008 may include memory (e.g., the memory 1004 may be representative of a storage device in addition to the memory of the GPUs 1008, the CPUs 1006, and/or other components). In other words, the computing device of FIG. 10 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 10.

The bus 1002 may represent one or more busses, such as an address bus, a data bus, a control bus, or a combination thereof. The bus 1002 may include one or more bus types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus.

The memory 1004 may include any of a variety of computer-readable media. The computer-readable media may be any available media that may be accessed by the computing device 1000. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 1004 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 1000. As used herein, computer-storage media does not comprise signals per se.

The communication media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the communication media may include wired media such as a wired network or direct-wired connection, and wireless media such as acoustic, RF, infrared and other wireless media. Combinations of any of the above should also be included within the scope of computer-readable media.

The CPU(s) 1006 may be configured to execute the computer-readable instructions to control one or more components of the computing device 1000 to perform one or more of the methods and/or processes described herein. The CPU(s) 1006 may each include one or more cores (e.g., one, two, four, eight, twenty-eight, seventy-two, etc.) that are capable of handling a multitude of software threads simultaneously. The CPU(s) 1006 may include any type of processor, and may include different types of processors depending on the type of computing device 1000 implemented (e.g., processors with fewer cores for mobile devices and processors with more cores for servers). For example, depending on the type of computing device 1000, the processor may be an ARM processor implemented using Reduced Instruction Set Computing (RISC) or an x86 processor implemented using Complex Instruction Set Computing (CISC). The computing device 1000 may include one or more CPUs 1006 in addition to one or more microprocessors or supplementary co-processors, such as math co-processors.

The GPU(s) 1008 may be used by the computing device 1000 to render graphics (e.g., 3D graphics). The GPU(s) 1008 may include hundreds or thousands of cores that are capable of handling hundreds or thousands of software threads simultaneously. The GPU(s) 1008 may generate pixel data for output images in response to rendering commands (e.g., rendering commands from the CPU(s) 1006 received via a host interface). The GPU(s) 1008 may include graphics memory, such as display memory, for storing pixel data. The display memory may be included as part of the memory 1004. The GPU(s) 1008 may include two or more GPUs operating in parallel (e.g., via a link). When combined together, each GPU 1008 may generate pixel data for different portions of an output image or for different output images (e.g., a first GPU for a first image and a second GPU for a second image). Each GPU may include its own memory, or may share memory with other GPUs.

In examples where the computing device 1000 does not include the GPU(s) 1008, the CPU(s) 1006 may be used to render graphics.

The communication interface 1010 may include one or more receivers, transmitters, and/or transceivers that enable the computing device 1000 to communicate with other computing devices via an electronic communication network, included wired and/or wireless communications. The communication interface 1010 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet), low-power wide-area networks (e.g., LoRaWAN, SigFox, etc.), and/or the Internet.

The I/O ports 1012 may enable the computing device 1000 to be logically coupled to other devices including the I/O components 1014, the presentation component(s) 1018, and/or other components, some of which may be built-in to (e.g., integrated in) the computing device 1000. Illustrative I/O components 1014 include a microphone, mouse, keyboard, joystick, game pad, game controller, satellite dish, scanner, printer, wireless device, etc. The I/O components 1014 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1000. The computing device 1000 may be include depth cameras, such as stereoscopic camera systems, infrared camera systems, RGB camera systems, touchscreen technology, and combinations of these, for gesture detection and recognition. Additionally, the computing device 1000 may include accelerometers or gyroscopes (e.g., as part of an inertia measurement unit (IMU)) that enable detection of motion. In some examples, the output of the accelerometers or gyroscopes may be used by the computing device 1000 to render immersive augmented reality or virtual reality.

The power supply 1016 may include a hard-wired power supply, a battery power supply, or a combination thereof. The power supply 1016 may provide power to the computing device 1000 to enable the components of the computing device 1000 to operate.

The presentation component(s) 1018 may include a display (e.g., a monitor, a touch screen, a television screen, a heads-up-display (HUD), other display types, or a combination thereof), speakers, and/or other presentation components. The presentation component(s) 1018 may receive data from other components (e.g., the GPU(s) 1008, the CPU(s) 1006, etc.), and output the data (e.g., as an image, video, sound, etc.).

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method comprising:
    performing multiple instances of a fault test on a hardware component of a computing platform by applying different values of a physical operating parameter to the hardware component for each of the instances;
    determining, from results of the multiple instances of the fault test, a value of the physical operating parameter at which the hardware component transitions from a pass of the fault test to a fail of the fault test;
    determining, based at least on the value of the physical operating parameter, a degradation rate indicating an amount of change to a cutoff value of the physical operating parameter at which the hardware component is capable of passing the fault test, the amount of change being relative to an elapsed time;
    determining the degradation rate exceeds a reference degradation rate; and
    determining one or more remedial actions based at least in part on the degradation rate exceeding the reference degradation rate.

2. The method of claim 1, wherein the determining the degradation rate of the cutoff value of the physical operating parameter includes:
    running multiple additional instances of the fault test on the hardware component by applying different values of the physical operating parameter to the hardware component for each of the additional instances;
    determining, from results of the multiple additional instances of the fault test, an additional value of the physical operating parameter at which the hardware component transitions from passing of the fault test to failing of the fault test;
    computing the amount of change based at least on a difference between the value and the additional value;
    computing the elapsed time based at least on an operational duration between the running of the multiple instances and the running of the multiple additional instances; and
    computing the degradation rate using the amount of change and the elapsed time.

3. The method of claim 1, wherein the physical operating parameter is a power supply voltage to the hardware component, and the degradation rate is to a minimum value of the power supply voltage at which the hardware component is capable of passing the fault test.

4. The method of claim 1, further comprising determining the results of each of the multiple instances of the fault test, the determining including for each instance comparing one or more outputs of the hardware component to one or more expected outputs of the hardware component.

5. The method of claim 1, wherein the hardware component includes a memory device, the fault test includes a built-in self-test of the memory device, and the performing, for at least one instance of the multiple instances of the fault test, includes applying a test pattern of the built-in self-test to the memory device.

6. The method of claim 1, wherein the degradation rate is a computed based at least on dividing the amount of change by the elapsed time.

7. The method of claim 1, wherein the degradation rate quantifies a rate at which latent defects are developing within at least the hardware component over the elapsed time.

8. The method of claim 1, wherein the reference degradation rate corresponds to an operational duration of the hardware component up until a time of performing the multiple instances of the fault test.

9. The method of claim 1, wherein the hardware component is of an automated driving system of a vehicle, and the one or more remedial actions include disabling autonomous driving of the vehicle.

10. A method comprising:
applying one or more test parameters of a fault test to a hardware component of a computing platform to produce one or more outputs of the hardware component;
determining a value of a performance characteristic of the hardware component based at least in part on analyzing the one or more outputs of the hardware component;
determining a degradation rate of the hardware component based at least on the value of the performance characteristic, the degradation rate indicating an amount of change to a capability of the hardware component relative to an elapsed time;
determining the degradation rate exceeds a reference degradation rate based at least in part on a measurement that indicates an operational duration of the hardware component; and
determining one or more remedial actions based at least in part on the degradation rate of the performance characteristic exceeding the reference degradation rate.

11. The method of claim 10, wherein the determining the value of the performance characteristic is based at least in part on comparing the one or more outputs of the hardware component and one or more expected outputs of the hardware component.

12. The method of claim 10, wherein the one or more outputs of the hardware component include a logical output and determining the value of the performance characteristic is based at least in part on a comparison between the logical output of the hardware component and an expected logical output of the hardware component.

13. The method of claim 10, wherein the determining the value of the performance characteristic is based at least in part on determining a level of an electrical characteristic of the one or more outputs of the hardware component.

14. The method of claim 10, wherein the performance characteristic corresponds to one or more of a minimum operating voltage, a minimum operating current, or a maximum operating clock speed under which the hardware component is capable of passing the fault test.

15. The method of claim 10, wherein the performance characteristic corresponds to a leakage current of the hardware component.

16. The method of claim 10, wherein the one or more outputs of the hardware component include output signals and determining the value of the performance characteristic includes:
determining one or more dimensions of an eye pattern formed by the output signals; and
determining the one or more dimensions of the eye pattern exceed a threshold value.

17. The method of claim 10, wherein the one or more remedial actions include causing presentation of an indicator of the degradation rate exceeding the reference degradation rate.

18. A system comprising:
a hardware component of an autonomous driving circuit of a vehicle, the hardware component used by the autonomous driving circuit to generate control signals that control autonomous driving of a vehicle while an operational value of a supply voltage is applied to the hardware component; and
one or more processing devices to:
execute multiple instances of a fault test on the hardware component by, at least in part, applying values of the supply voltage to the hardware component that are less than the operational value to determine a value that corresponds to a minimum supply voltage at which the hardware component is capable of passing the fault test;
determine a degradation rate of the minimum supply voltage based at least on the value that corresponds to the minimum supply voltage, the degradation rate indicating an amount of change to the minimum supply voltage relative to an elapsed time; and
determine one or more remedial actions based at least in part on the degradation rate of the minimum supply voltage.

19. The system of claim 18, wherein the autonomous driving circuit and the one or more processing devices are implemented on a System on-chip (SoC).

20. The system of claim 18, wherein the value that corresponds to the minimum supply voltage is determined based at least on identifying a transition between a first of the values of the supply voltage at which the hardware component passes the fault test and a second of the values of the supply voltage at which the hardware component fails the fault test.

* * * * *